United States Patent
Oi et al.

(10) Patent No.: US 8,497,140 B2
(45) Date of Patent: *Jul. 30, 2013

(54) ENCAPSULANT LAYER FOR PHOTOVOLTAIC MODULE, PHOTOVOLTAIC MODULE AND METHOD FOR MANUFACTURING REGENERATED PHOTOVOLTAIC CELL AND REGENERATED TRANSPARENT FRONT FACE SUBSTRATE

(75) Inventors: Kasumi Oi, Tokyo (JP); Takaki Miyachi, Tokyo (JP); Isao Inoue, Tokyo (JP); Koujiro Ohkawa, Tokyo (JP); Hiroki Nakagawa, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 134 days.

This patent is subject to a terminal disclaimer.

(21) Appl. No.: 13/071,781

(22) Filed: Mar. 25, 2011

(65) Prior Publication Data

US 2011/0183442 A1 Jul. 28, 2011

Related U.S. Application Data

(62) Division of application No. 10/936,974, filed on Sep. 9, 2004, now Pat. No. 7,935,884.

(30) Foreign Application Priority Data

Sep. 10, 2003 (JP) ................................. 2003-318544
May 27, 2004 (JP) ................................. 2004-157847

(51) Int. Cl.
*H01L 31/18* (2006.01)

(52) U.S. Cl.
USPC ....................................... 438/4; 257/E31.117

(58) Field of Classification Search
None
See application file for complete search history.

(56) References Cited

U.S. PATENT DOCUMENTS 4,288,497 A 9/1981 Tanaka et al.
4,351,876 A 9/1982 Doi et al.
(Continued)

FOREIGN PATENT DOCUMENTS

JP 58-060579 A 4/1983
JP 58-063178 A 4/1983
(Continued)

OTHER PUBLICATIONS

USPTO OA mailed Nov. 15, 2007 in connection with U.S. Appl. No. 10/936,974.
(Continued)

*Primary Examiner* — Seahvosh Nikmanesh
(74) *Attorney, Agent, or Firm* — Ladas & Parry LLP

(57) ABSTRACT

An encapsulant layer for a photovoltaic module enabling recovering and recycling or reusing of reutilizeable resources such as a transparent front face substrate and photovoltaic cell and the like among constituents of a photovoltaic module, and a method for manufacturing a regenerated photovoltaic cell and a regenerated transparent front face substrate. The photovoltaic module is formed by laminating: a transparent front face substrate; a photovoltaic cell carrying a wiring electrode and a takeoff electrode, and an encapsulant layer is placed on at least one surface; and a rear face protecting sheet. The encapsulant layer is a separable layer formed mainly of a thermoplastic resin, and an output maintenance factor of photoelectronic power of the photovoltaic module using the encapsulant layer is in a range of 80% to 100%.

6 Claims, 2 Drawing Sheets

U.S. PATENT DOCUMENTS

| | | | |
|---|---|---|---|
| 4,413,066 | A | 11/1983 | Isaka et al. |
| 4,446,283 | A | 5/1984 | Doi et al. |
| 4,614,764 | A | 9/1986 | Colombo et al. |
| 4,659,752 | A | 4/1987 | Piret |
| 4,689,369 | A | 8/1987 | Ishino et al. |
| 4,818,789 | A | 4/1989 | Tomko et al. |
| 5,169,900 | A | 12/1992 | Gudelis |
| 5,264,285 | A | 11/1993 | Dougherty |
| 5,478,402 | A | 12/1995 | Hanoka |
| 5,660,646 | A | 8/1997 | Kataoka et al. |
| 5,798,048 | A | 8/1998 | Ries |
| 6,262,358 | B1 | 7/2001 | Kamimura et al. |
| 6,271,462 | B1 | 8/2001 | Tsuzuki et al. |
| 6,414,236 | B1 | 7/2002 | Kataoka |
| 6,472,594 | B1 | 10/2002 | Ichinose et al. |
| 6,586,271 | B2 | 7/2003 | Hanoka |
| 7,935,884 | B2 * | 5/2011 | Oi et al. ............ 136/251 |
| 2002/0038664 | A1 | 4/2002 | Zenko et al. |
| 2003/0000568 | A1 | 1/2003 | Gonsiorawski |
| 2003/0040575 | A1 | 2/2003 | Stark et al. |
| 2005/0000560 | A1 | 1/2005 | Shiotsuka et al. |
| 2005/0051204 | A1 * | 3/2005 | Oi et al. ............ 136/251 |
| 2006/0201544 | A1 | 9/2006 | Inoue |

FOREIGN PATENT DOCUMENTS

| | | |
|---|---|---|
| JP | 03-207644 A | 9/1991 |
| JP | 04-007145 A | 1/1992 |
| JP | 05-186610 A | 7/1993 |
| JP | 11-289103 A | 10/1999 |
| JP | 2000-183382 A | 6/2000 |
| JP | 2000-186114 A | 7/2000 |
| JP | 2001-077390 A | 3/2001 |
| JP | 2002-009309 A | 1/2002 |
| JP | 2002-235048 A | 8/2002 |
| JP | 2003-046104 A | 2/2003 |
| JP | 2003-046105 A | 2/2003 |
| JP | 2003-049004 A | 2/2003 |
| JP | 2003-138034 A | 5/2003 |

OTHER PUBLICATIONS

USPTO OA mailed Aug. 7, 2008 in connection with U.S. Appl. No. 10/936,974.

USPTO OA mailed Jan. 30, 2009 in connection with U.S. Appl. No. 10/936,974.

USPTO OA mailed Sep. 1, 2009 in connection with U.S. Appl. No. 10/936,974.

USPTO OA mailed Apr. 27, 2010 in connection with U.S. Appl. No. 10/936,974.

USPTO OA mailed Dec. 21, 2010 in connection with U.S. Appl. No. 10/936,974.

* cited by examiner

ENCAPSULANT LAYER FOR PHOTOVOLTAIC MODULE, PHOTOVOLTAIC MODULE AND METHOD FOR MANUFACTURING REGENERATED PHOTOVOLTAIC CELL AND REGENERATED TRANSPARENT FRONT FACE SUBSTRATE

BACKGROUND OF THE INVENTION

1. Field of the Invention

The present invention relates to an encapsulant layer for photovoltaic module comprising a transparent front face substrate, photovoltaic cell and a separable layer, to a method for manufacturing a regenerated photovoltaic cell and a regenerated transparent front face substrate and to a method for reutilizing a photovoltaic module.

2. Description of Related Art

Recently, since environmental problems are more and more concerned, a solar photovoltaic generation system as an inexhaustible and clean energy source attracts attention, and its amount of production is increasing year by year.

However, for an active use of a solar photovoltaic generation system in a large scale, further significant cost down is essential. Specifically, it is required to realize a power generating cost corresponding to existing electric power generating systems such as thermal power generation and the like, to reduce the energy consumed to manufacture a photovoltaic cell and photovoltaic module, and to reduce the cost of constituents.

When large scale introduction of a solar photovoltaic generation system is realized, a large scale disposal of the equivalent amount is concerned. Under insistence of necessity of resource circulating type society construction, it is not desirable for the solar photovoltaic generation systems expected to support the future clean energy sources to inherit current industrial waste treating methods and to consume resources in large amount. Therefore, it is necessary to construct a recycle system suppressing consumption of resources and reducing load on environments by efficient use of substances, recycle or reuse thereof. Further, it is necessary to develop a photovoltaic module enabling realization of its recycling system.

A photovoltaic module is generally formed by sequentially laminating a transparent front face substrate, encapsulant sheet, a photovoltaic cell, encapsulant sheet and rear face protecting sheet, and these are fixed by an aluminum outer frame to give a module. A plurality of these modules are arranged to be a unit to give a solar photovoltaic generation system.

Of these constituents, a transparent front face substrate such as glass and the like and a photovoltaic cell are resources which show small damages as compared with surrounding members even exposed to solar light for a long period of time and which can be reutilized.

However, in many photovoltaic modules currently marketed, an EVA (ethylene-vinyl acetate copolymer resin) sheet is used as an encapsulant sheet, and since a thermo-setting EVA sheet is very difficult to be separated from other module constituents, it is difficult to recover a transparent front face substrate and a photovoltaic cell from a used module. In addition, a heat cross-linking process for a long period of time is necessary, increasing energy amount in manufacturing a module. Further, there is a problem that an acidic gas is generated as an out gas in cross-linking which deteriorates circumferential environments, and additionally, a photovoltaic cell and electrode and the like are damaged and deteriorated.

Prior technological literatures for the present invention have not been found.

SUMMARY OF THE INVENTION

The main object of the present invention is to provide an encapsulant layer for photovoltaic module used in a photovoltaic module enabling recovering and recycling or reusing of reutilizeable resources such as a transparent front face substrate and photovoltaic cell and the like among constituents of a photovoltaic module, and to provide a method for manufacturing a regenerated photovoltaic cell and a regenerated transparent front face substrate, of which reutilize is particularly desired because of high cost, among reutilizeable resources of a photovoltaic module.

The present inventors have intensively studied in view of the above mentioned facts and resultantly found that reutilizeable resources such as a photovoltaic cell and the like can be easily recovered from used photovoltaic modules, by providing a separable layer, as an encapsulant layer, formed mainly of a thermoplastic resin, leading to completion of the invention.

That is, the present invention provides an encapsulant layer for photovoltaic module, wherein the encapsulant layer for photovoltaic module is used in a photovoltaic module formed by laminating: a transparent front face substrate; a photovoltaic cell carrying a wiring electrode and a takeoff electrode, and an encapsulant layer is placed on at least one surface; and a rear face protecting sheet, in this order, comprising a separable layer formed mainly of a thermoplastic resin (a) having a peeling strength from the transparent front face substrate, measured in a 180° peeling test under a 25° C. atmosphere, in a range of 1 N/15 mm width to 150 N/15 mm width, (b) having a Vicat softening temperature, measured based on JIS standard K7206, in a range of 60° C. to 128° C., and (c) having a melt mass flow rate, measured based on JIS standard K7210, in a range of 0.1 g/10 min to 50 g/10 min, and wherein (d) an output maintenance factor of photoelectronic power, before and after a test measured based on a standard, of the photovoltaic module using the encapsulant layer is in a range of 80% to 100%.

In the present invention, the encapsulant layer for photovoltaic module has a separable layer composed mainly of a thermoplastic resin. Therefore, there is a merit that reutilizeable resources can be easily recovered from a used photovoltaic module. Further, in the present invention, a photovoltaic module using the above mentioned encapsulant layer for photovoltaic module, because of the property as described above, can sufficiently satisfy properties required as a photovoltaic module.

In the above mentioned invention, it is preferable that the encapsulant layer placed in between the transparent front face substrate and the photovoltaic cell (e) has a total ray transmittance in a range of 70% to 100%. The encapsulant layer placed in between the transparent front face substrate and the photovoltaic cell preferably has total ray transmittances in the above mentioned range, in view of power generation efficiency.

It is preferable that the above mentioned separable layer is placed so as to contact with the both surfaces of the photovoltaic cell and the transparent front face substrate. The reason for this is that since the separable layer is in contact with the both surfaces of the photovoltaic cell and the transparent front face substrate, the photovoltaic cell and transparent front face substrate can be easily separated from a used photovoltaic module, and additionally, the encapsulant layer adhered to the photovoltaic cell and transparent front face substrate can be easily removed.

In this case, the above mentioned encapsulant layer may be obtained by laminating the separable layer, a filling layer formed of a resin composition different from that of the separable layer, and the separable layer, in this order. The reason for this is that in removing the photovoltaic cell and transparent front face substrate from a photovoltaic module, only the part of the encapsulant layer in contact with them is required to be a filling layer.

On the other hand, in the present invention, the above mentioned encapsulant layer may be formed only of the above mentioned separable layer. The reason for this is that since the encapsulant layer is formed only of the separable layer, each constituent can be easily separated from a used photovoltaic module, and additionally, encapsulant layers adhered to each constituent can be easily removed, consequently, reutilizeable resources such as a photovoltaic cell, transparent front face substrate and the like can be recovered by a simpler method.

In the above mentioned invention, it is preferable that the peeling strength between the encapsulant layer and the transparent front face substrate, measured in a 180° peeling test under a 25° C. atmosphere, after the photovoltaic module is left under high temperature and high humidity conditions of 85° C. and 85% for 1000 hours is in a range of 0.5 N/15 mm width to 140 N/15 mm width. The reason for this is that when the peeling strength from the transparent front face substrate is in this range, it can sufficiently stand use for a long period of time.

It is preferable that such a thermoplastic resin is a copolymer of a polyethylene for polymerization and an ethylenically unsaturated silane compound.

It is preferable that the above mentioned thermoplastic resin further contains a polyethylene for addition. The reason for this is that the cost for manufacturing a photovoltaic module can be suppressed.

In the above mentioned invention, it is preferable that the separable layer contains Si (silicon) in an amount of 8 ppm to 3500 ppm in terms of polymerized Si amount. The reason for this is that by containing polymerized Si by an amount in this range, adhesion to a photovoltaic cell, transparent front face substrate and rear face protecting sheet can be improved.

It is preferable that the gel fraction of the above mentioned separable layer is 30% or less. When the gel fraction is over the above mentioned range, processability in manufacturing a photovoltaic module lowers, and improvement in close adherence with a transparent front face substrate and rear face protecting sheet is not confirmed. Further, when the gel fraction is over the above mentioned range, it is difficult to reutilize members contained in the photovoltaic module, for example, a photovoltaic cell and transparent front face substrate.

It is preferable that the separable layer used in the present invention further contains at least one additive selected from the group consisting of photo-stabilizers, ultraviolet absorbers, thermo-stabilizers and antioxidants. The reason for this is that by containing these additives, mechanical strength, prevention of yellowing, prevention of cracking, and excellent processing propriety stable over a long period of time can be obtained.

The present invention also provides a photovoltaic module using the above mentioned encapsulant layer for photovoltaic module.

Further, the present invention provides a method for manufacturing a regenerated photovoltaic cell, wherein a regenerated photovoltaic cell is obtained from the above mentioned photovoltaic module, comprising:

a heating process of heating the photovoltaic module at temperatures not lower than the softening temperature of a thermoplastic resin which is a constituent material of the separable layer;

a separating process of peeling the separable layer, plasticized by heating, to separate the photovoltaic cell; and a removing process of removing the encapsulant layer adhered to the photovoltaic cell.

In the above mentioned method, there is a merit that a regenerated photovoltaic cell can be easily manufactured, since a photovoltaic cell can be easily separated from a used photovoltaic module.

It is preferable that the above mentioned removing process is carried out by physical cleaning of physically removing the encapsulant layer, chemical cleaning of chemically removing the encapsulant layer, or a combination thereof.

Furthermore, the present invention provides a method for manufacturing a regenerated transparent front face substrate, wherein a regenerated transparent front face substrate is obtained from the photovoltaic module according to claim 12, comprising:

a heating process of heating the photovoltaic module at temperatures not lower than the softening temperature of a thermoplastic resin which is a constituent material of the separable layer;

a separating process of peeling the separable layer, plasticized by heating, to separate the transparent front face substrate; and a removing process of removing the encapsulant layer adhered to the transparent front face substrate.

In the above mentioned method, there is a merit that a regenerated transparent front face substrate can be easily manufactured, since a transparent front face substrate can be easily separated from a used photovoltaic module.

It is preferable that the above mentioned removing process is carried out by physical cleaning of physically removing the encapsulant layer, chemical cleaning of chemically removing the encapsulant layer, or a combination thereof.

The present invention also provides a method for reutilizing a photovoltaic module, wherein a member from the photovoltaic module according to claim 12 is reutilized, comprising:

a heating process of heating the photovoltaic module at temperatures not lower than the softening temperature of a thermoplastic resin which is a constituent material of the separable layer; and a separating process of peeling the separable layer plasticized by heating to separate the transparent front face substrate. In this method, a photovoltaic cell or transparent front face substrate can be easily reutilized (recycle or reuse).

In the above mentioned method for reutilizing a photovoltaic module, it is preferable that the separating process comprises a rear face protecting sheet separating process of separating a rear face protecting sheet from the photovoltaic module. For example, when a material generating a harmful gas by heating such as a fluorine resin and the like is used as the rear face protecting sheet, load on environments in reutilizing a photovoltaic module can be decreased by comprising a rear face protecting sheet separating process of separating a rear face protecting sheet from the above mentioned photovoltaic module.

In the encapsulant layer for photovoltaic module of the present invention, each constituent can be easily separated by heating the photovoltaic module, using this encapsulant layer, at temperatures not lower than the softening temperature of a thermoplastic resin which is a main component of the separable layer. Therefore, there is a merit that reutilizeable resources such as a photovoltaic cell and transparent front face substrate and the like can be easily recovered from a used photovoltaic module. The recovered resources can be reused as they are as constituents of a photovoltaic module, or can be recycled by heat-melting to give other materials to be used. Particularly, it is useful in that a regenerated photovoltaic cell and a regenerated transparent front face substrate can be easily obtained from a used photovoltaic module.

DESCRIPTION OF THE PREFERRED EMBODIMENTS

The present invention includes an encapsulant layer for photovoltaic module, a photovoltaic module using the same, and a method for manufacturing a regenerated photovoltaic cell and regenerated transparent front face substrate, further, a method for reutilizing a photovoltaic module. These will be explained in detail below.

A. Encapsulant Layer for Photovoltaic Module

The encapsulant layer for photovoltaic module of the present invention is an encapsulant layer for photovoltaic module, wherein the encapsulant layer for photovoltaic module is used in a photovoltaic module formed by laminating: a transparent front face substrate; a photovoltaic cell carrying a wiring electrode and a takeoff electrode, and an encapsulant layer is placed on at least one surface; and a rear face protecting sheet, in this order, comprising a separable layer formed mainly of a thermoplastic resin (a) having a peeling strength from the transparent front face substrate, measured in a 180° peeling test under a 25° C. atmosphere, in a range of 1 N/15 mm width to 150 N/15 mm width, (b) having a Vicat softening temperature, measured based on JIS standard K7206, in a range of 60° C. to 128° C., and (c) having a melt mass flow rate, measured based on JIS standard K7210, in a range of 0.1 g/10 min to 50 g/10 min, and wherein (d) an output maintenance factor of photoelectronic power, before and after a test measured based on a standard, of the photovoltaic module using the encapsulant layer is in a range of 80% to 100%.

Figure 1:
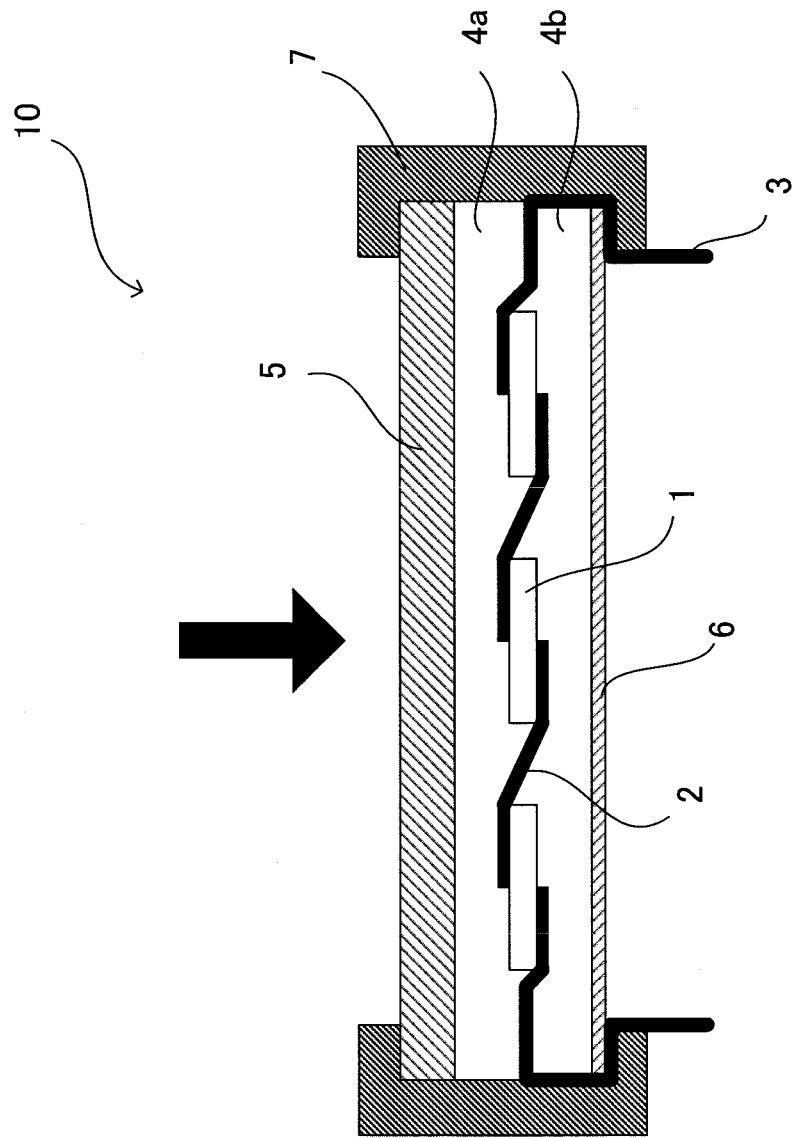
FIG. 1 is a schematic sectional view showing one example of the photovoltaic module of the present invention.

The constitution of a photovoltaic module using an encapsulant layer for photovoltaic module of the present invention will be explained referring to a drawing. FIG. 1 is a schematic sectional view showing one examples of such photovoltaic module. A plurality of the photovoltaic cells 1 is arranged in the same plane. And in between the photovoltaic cells, the wiring electrodes 2 and the takeoff electrodes 3 are placed. The photovoltaic cell 1 is sandwiched between an upper encapsulant layer 4a and a lower encapsulant layer 4b, and the transparent front face substrate 5 is laminated on the outside of the upper encapsulant layer 4a, and the rear face protecting sheet 6 is laminated on the outside of the lower encapsulant layer 4b. This photovoltaic module 10 may be fixed by the outer frame 7 formed of aluminum and the like. An encapsulant layer for photovoltaic module used in such photovoltaic module will be described below.

the encapsulant layer of the present invention is an adhesive protecting sheet for directly fixing a photovoltaic cell and other circumferential wirings, and has a function to adhere to a transparent front face substrate or to a rear face protecting sheet.

In the present invention, the above mentioned encapsulant layer may be placed on at least one surface of the photovoltaic cell as described above, however, a configuration, in which the encapsulant layers are placed on both surfaces of the photovoltaic cell and sandwich the photovoltaic cell, is preferable.

It is necessary that the encapsulant layer used in the photovoltaic module of the present invention satisfies the following condition (a) for sufficing required properties of a photovoltaic module.

(a) Close Adherence to Transparent Front Face Substrate

The encapsulant layer for photovoltaic module of the present invention plays a role to adhere the photovoltaic cell to the transparent front face substrate. Therefore, high close adherence between the encapsulant layer and transparent front face substrate is necessary.

In the present invention, a peeling strength of the encapsulant layer from the transparent front face substrate, which is measured in a 180° peeling test under 25° C. atmosphere, is in a range of 1 N/15 mm width to 150 N/15 mm width, preferably in a range of 3 N/15 mm width to 150 N/15 mm width, more preferably in a range of 10 N/15 mm width to 150 N/15 mm width.

The above mentioned peeling strength is a value obtained by the following test method.

Testing machine: Tensile testing machine manufactured by A & D Co., LTD. [machine name: Tensilon]

Measuring angle: 180° peeling

Peeling speed: 50 mm/min

Within this range, close adherence between the transparent front face substrate and the encapsulant layer is sufficient, and generation of voids at the adhesion interface thereof can be suppressed.

The encapsulant layer used in the present invention preferably has the above mentioned property for a long period of time, and the peeling strength between the encapsulant layer and the transparent front face substrate, measured in a 180° peeling test under a 25° C. atmosphere, after the above mentioned photovoltaic module being left for 1000 hours under high temperature and high humidity conditions of 85° C. and 85% is preferably in a range of 0.5 N/15 mm width to 140 N/15 mm width, more preferably in a range of 3 N/15 mm width to 140 N/15 mm width, further preferably in a range of 10 N/15 mm width to 140 N/15 mm width. As the measuring method, the same method as described above is used.

The encapsulant layer for photovoltaic module of the present invention, when placed in between the transparent front face substrate and the photovoltaic cell, preferably has a property (e) as described below.

(e) Ray Transmittance

The encapsulant layer used in between the transparent front face substrate and the photovoltaic cell is required to have high ray transmittance. In the present invention, the total ray transmittance of an encapsulant layer is in a range of 70% to 100%, preferably 80% to 100%, more preferably 90% to 100%.

The total ray transmittance can be measured by a usual method, and for example, it can be measured by a color computer.

The encapsulant layer used in between the rear face protecting sheet and the photovoltaic cell is not particularly required to have total ray transmittance as described above, and rather, this encapsulant layer is preferably an encapsulant layer colored by filling an inorganic pigment, for design and improvement in power generation efficiency by reflecting light.

The encapsulant layer used in the present invention satisfies the required property as described above, and has the separable layer mainly formed of a thermoplastic resin.

In the photovoltaic module of the present invention, the encapsulant layer is preferably constituted only of the separable layer, and may also have a multi-layered structure with the separable layer and the filling layer which is formed of a resin composition which is different from that of the separable layer.

When the encapsulant layer is constituted only of the separable layer, each constituent can be easily separated from a used photovoltaic module, and in addition, the encapsulant layer adhered to each constituent can be removed easily, therefore, it is advantageous in that reutilizeable resources such as the transparent front face substrate and photovoltaic cell and the like can be recovered by a simpler method.

On the other hand, in the case of a multi-layered structure, the constitution is not particularly limited as long as it is constituted of the separable layer and the filling layer, and for example, constitutions such as a two-layered structure composed of the separable layer and the filling layer, a three-layered structure obtained by laminating the separable layer, the filling layer and the separable layer in this order, and the like can be presented. By thus using a filling layer, the using amount of a relatively expensive separable layer material can be reduced. Therefore, it is advantageous from the standpoint of the cost.

When the encapsulant layer has a multi-layered structure, in the photovoltaic module of the present invention, it is preferable that separable layers are placed so as to contact with the both surfaces of the photovoltaic cell and the transparent front face substrate. The reason for this is that when separable layers are placed so as to contact with the photovoltaic cell and the transparent front face substrate, separable layers can be plasticized by heating, consequently, the photovoltaic cell and the transparent front face substrate can be easily removed, additionally, separable layers adhered to the photovoltaic cell and the transparent front face substrate can be easily removed. Thus recovered photovoltaic cell and transparent front face substrate can be reutilized as a regenerated photovoltaic cell and regenerated transparent front face substrate.

Therefore, when the encapsulant layer has a multi-layered structure, a three-layered structure obtained by laminating the above mentioned separable layer, filling layer and separable layer in this order is particularly preferable.

Even if the filling layer is placed in contact with the photovoltaic cell, the amount of the filling layer adhered to the photovoltaic cell can be decreased by selecting the material of the filling layer. Therefore, this is useful, for example, in that a regenerated photovoltaic cell can be obtained by chemical cleaning and the like. Moreover when the filling layer is placed in contact with the transparent front face substrate, the filling layer adhered can be removed by chemical cleaning and reused, and the amount of the adhered substance can be suppressed low, so that recycling becomes possible by heat-melting.

The separable layer and filling layer will be described below.

(1) Separable Layer

The separable layer is, as described above, a layer mainly formed of a thermoplastic resin. Here, "mainly formed of" means that the separable layer material contains a thermoplastic resin in an amount of 50 wt % or more, preferably 70 wt % or more, more preferably 90 wt % or more.

In the present invention, since the encapsulant layer has a separable layer mainly formed of a thermoplastic resin, the separable layer can be plasticized by heating at temperatures not lower than the softening temperature of the thermoplastic resin, the separable layer can be peeled and reutilizeable resources such as the photovoltaic cell and the like can be easily recovered and reused or recycled.

It is necessary that such the thermoplastic resin (b) has a Vicat softening temperature, measured based on JIS standard K7206, in a range of 60° C. to 128° C., preferably from 60° C. to 115° C., further preferably from 60° C. to 110° C.

Since the thermoplastic resin has a softening temperature in this range, the separable layer can be easily plasticized without damaging other constituents of the photovoltaic module.

The thermoplastic resin used in the present invention (c) has a melt mass flow rate, measured based on JIS standard K7210, in a range of 0.1 g/10 min to 50 g/10 min, preferably from 0.1 g/10 min to 10 g/10 min, more preferably from 0.5 g/10 min to 8 g/10 min.

Within this range, the flowability of the thermoplastic resin in manufacturing the photovoltaic module is suitable, therefore, processability is excellent, and additionally, when the separable layer and other constituents such as the transparent front face substrate and the like are laminated so that they directly come into mutual contact, close adherence at the interface is secured sufficiently.

Further, the thermoplastic resin used in the present invention is preferably a resin revealing no yellowing even if exposed to solar ray for a long period of time. Specifically, the degree of yellowing measured based on JIS standard K7105 is preferably 50% increase or less, more preferably 25% increase or less, further preferably 5% increase or less.

The thermoplastic resin which is a material of the separable layer, and other additives will be explained specifically below.

(Thermoplastic Resin)

The thermoplastic resin used in the present invention is not particularly limited as long as it satisfies the above mentioned required property, and for example, a copolymer of a polyethylene for polymerization and an ethylenically unsaturated silane compound is mentioned as a preferable example.

In the present invention, the copolymer may be any of a random copolymer, alternative copolymer, block copolymer and graft copolymer. Among them, particularly when close adherence with other constituents such as the transparent front face substrate and the like is necessary, a graft copolymer is preferable, and in the case of a graft copolymer, a silane-modified resin, wherein an ethylenically unsaturated silane compound is arranged as a side chain on a main chain of a polyethylene for polymerization, is preferable.

The polyethylene for polymerization used in the present invention is not particularly limited as long as it is a polyethylene-based polymer, and specifically, low density polyethylene, middle density polyethylene, high density polyethylene, super low density polyethylene, ultra super low density polyethylene and straight chain low density polyethylene are preferable. These can be used singly or in combination of two or more.

Further, the above mentioned polyethylene for polymerization is preferably a polyethylene having many side chains. Usually, a polyethylene having many side chains has low density, and a polyethylene having a small number of side chains has high density. Therefore, a polyethylene of low density is preferable. In the present invention, the density of a polyethylene for polymerization is preferably in a range of 0.850 to 0.960 g/cm$^3$, more preferably in a range of 0.865 to 0.930 g/cm$^3$. The reason for this is that when the polyethylene for polymerization is a polyethylene having many side chains, namely, a polyethylene of low density, there is a tendency that an ethylenically unsaturated silane compound is graft-polymerized to a polyethylene for polymerization.

On the other hand, the ethylenically unsaturated silane compound used in the present invention is not particularly limited, and preferable is at least one selected from the group consisting of vinyltrimethoxysilane, vinyltriethoxysilane, vinyltripropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyloxysilane, vinyltriacetoxysilane and vinyltricarboxysilane.

The method for manufacturing the above mentioned copolymer is not particularly limited, and the above mentioned copolymer can be synthesized by a usual method. For example, the copolymer can be obtained by mixing the above mentioned polyethylene for polymerization, the above mentioned ethylenically unsaturated silane compound and a catalyst and polymerizing them at high temperatures. In this procedure, the heating temperature is preferably 300° C. or less, more preferably 270° C. or less. The reason for this is that when the temperature is higher than this, a silanol group portion tends to be cross-linked to be a gel.

Particularly in the case of obtaining a graft copolymer, copolymer can be obtained by mixing and heat-melting a polyethylene for polymerization, ethylenically unsaturated silane compound and free radical generator. Preferable heating temperature is the same as described above.

Examples of free radical generator include: hydroperoxides such as diisopropylbenzene hydroperoxide, 2,5-dimethyl-2,5-di(hydroperoxy)hexane and the like; dialkyl peroxides such as di-t-butyl peroxide, t-butyl cumyl peroxide, dicumyl peroxide, 2,5-dimethyl-2,5-di(t-butyl peroxy)hexane, 2,5-dimethyl-2,5-di(t-butyl peroxy)hexane-3 and the like; diacyl peroxides such as bis-3,5,5-trimethyl hexanyl peroxide, octanoyl peroxide, benzoyl peroxide, o-methylbenzoyl peroxide, 2,4-dichlorobenzoyl peroxide and the like; peroxy esters such as t-butyl-peroxy isobutyrate, t-butyl peroxy cyanate, t-butyl peroxy-2-ethyl hexanoate, t-butyl peroxy pivalate, t-butyl peroxy octoate, t-butyl peroxy isopropyl carbonate, t-butyl peroxy benzoate, di-t-butyl peroxy phthalate, 2,5-dimethyl-2,5-di(benzoyl peroxy)hexane, 2,5-dimethyl-2,5-di(benzoyl peroxy)hexane-3 and the like; organic peroxides such as ketone peroxides such as methyl ethyl ketone peroxide, cyclohexanone peroxide and the like, or azo compounds such as azobisisobutyronitrile, azobis(2,4-dimethylvaleronitrile) and the like.

The using amount of the free radical generator is preferably 0.001 wt % or more in the above mentioned silane-modified resin.

In the above mentioned copolymer, the using amount of an ethylenically unsaturated silane compound is preferably in a range of 0.001 parts by weight to 4 parts by weight, more preferably in a range of 0.01 parts by weight to 3 parts by weight, based on 100 parts by weight of a polyethylene for polymerization.

It is preferable that the thermoplastic resin used in the present invention further contains a polyethylene for addition in addition to the above mentioned copolymer. The reason for this is that since the above mentioned copolymer is expensive, it is more advantageous, from the standpoint of cost, to form the separable layer by mixing the polyethylene for addition than to form the separable layer only with the copolymer.

The polyethylene for addition used in the present invention is preferably at least one selected from the group consisting of low density polyethylene, middle density polyethylene, high density polyethylene, super low density polyethylene, and straight chain low density polyethylene.

The content of the polyethylene for addition is preferably in a range of 0.01 parts by weight to 9900 parts by weight, more preferably in a range of 90 parts by weight to 9900 parts by weight, based on 100 parts by weight of the above mentioned copolymer.

When two or more of the above mentioned copolymers are utilized, it is preferable that the content of the polyethylene for addition is in the above mentioned range based on 100 parts by weight of the total amount thereof.

(Other Additives)

As the material of the separable layer, it is preferable that at least one additive selected from the group consisting of photo-stabilizers, ultraviolet absorbers, thermo-stabilizer and antioxidants is further contained. The reason for this is that by inclusion of these additives, mechanical strength, prevention of yellowing, prevention of cracking and excellent processing propriety stable over a long period of time can be obtained.

The photo-stabilizer arrests an active species, which initiates light deterioration, in the thermoplastic resin used in the separable layer and prevents photo oxidation. Specifically, photo-stabilizers such as hindered amine-based compounds, hindered piperidine compounds and the like can be listed.

The ultraviolet absorber absorbs harmful ultraviolet ray in solar light, converts the ray into harmless thermal energy in the molecule, and prevents excitation of an active species, which initiates light deterioration, in the thermoplastic resin used in the separable layer. Specifically, inorganic ultraviolet absorbers such as benzophenone-based absorbers, benzotriazole-based absorbers, salicylate-based absorbers, acrylonitrile-based absorbers, metal complex salt-based absorbers, hindered amine-based absorbers, ultra fine particle titanium oxide (particle size: 0.01 μm to 0.06 μm), or ultra fine particle zinc oxide (particle size: 0.01 μm to 0.04 μm) and the like can be listed.

As the thermo-stabilizer: phosphorus-based thermo-stabilizers such as tris(2,4-di-t-butylphenyl) phosphite, vis [2,4-bis(1,1-dimethylethyl)-6-methylphenyl]ethyl phosphite, tetrakis(2,4-di-t-butylphenyl) [1,1-biphenyl]-4,4'-diylbisphosphonite, bis(2,4-di-t-butylphenyl) pentaerythritol diphosphite and the like; lactone-based thermo-stabilizers such as a reaction product of 8-hydroxy-5,7-di-t-butyl-furan-2-one with o-xylene, and the like can be listed. It is preferable to use a phosphorus-based thermo-stabilizer and a lactone-based thermo-stabilizer together.

The antioxidant prevents deterioration by oxidation of a thermoplastic resin used in the separable layer. Specific examples thereof include phenol-based, amine-based, sulfur-based, phosphorus-based, lactone-based antioxidants and the like.

These photo-stabilizers, ultraviolet absorbers, thermo-stabilizers and antioxidants can be used singly or in combination of two or more.

The content of photo-stabilizers, ultraviolet absorbers, thermo-stabilizers and antioxidants differs depending on its particle shape, density and the like, and preferably in a range of 0.001 wt % to 5 wt % based on materials in the separable layer.

(Separable Layer)

In the present invention, it is preferable that Si (silicon) is contained in the above mentioned separable layer, in an amount in a range of 8 ppm to 3500 ppm, particularly 10 ppm to 3000 ppm, more particularly 50 ppm to 2000 ppm, in terms of polymerized Si amount. The reason for this is that when polymerized Si amount is in this range, close adherence with the transparent front face substrate or the photovoltaic cell can be kept excellent.

In the present invention, as a method for measuring polymerized Si amount, there is used a method in which only an encapsulant layer is heated, burnt and ashed, consequently, polymerized Si is converted into $SiO_2$, and the ash is melted in an alkali and dissolved in pure water, then, its volume was controlled into a constant volume and polymerized Si amount was quantified by an ICP emission analysis (high frequency plasma emission analysis apparatus: manufactured by Shimadzu Corporation, ICPS8100) method.

It is preferable that the gel fraction of the separable layer used in the photovoltaic module of the present invention is 30% or less, particularly 10% or less, more particularly 0%. When the gel fraction is over the above mentioned range, processability in manufacturing the photovoltaic module lowers, and improvement in close adherence with the transparent front face substrate and rear face protecting sheet is not recognized. Further, when the gel fraction is over the above mentioned range, it is difficult to reutilize members contained in the photovoltaic module, for example, the photovoltaic cell and the transparent front face substrate.

The gel fraction of the separable layer in the present invention means a gel fraction of the separable layer when a photovoltaic module is manufactured, by using usual molding methods such as a lamination method in which layers such as transparent front face substrate, encapsulant layer, photovoltaic cell, encapsulant layer and rear face protecting sheet are laminated in this order, and then, these are made into an integrated molded body, vacuum-sucked and thermocompressed as an integrated body.

In such a method for measuring gel fraction: 1 g of the encapsulant layer for photovoltaic module is weighed and placed in a 80 mesh wire gauze bag; the sample is placed together with the wire gauze into a Soxhlet extractor, and xylene is refluxed under its boiling point; after continuous extraction for 24 hours, the sample is removed together with the wire gauze, dried, then, weighed, and the weight before extraction and the weight after extraction is compared and wt % of remaining insoluble components is measured as a gel fraction.

In the separable layer used in the present invention, although it is not particularly limited, a silanol condensation catalyst promoting a dehydration condensation reaction between silanols of silicone, such as dibutyltin diacetate, dibutyltin dilaurate, dibutyltin dioctate and dioctyltin dilaurate may be added in the separable layer by an amount of 0.05 parts by weight or less based on 100 parts by weight of a thermoplastic resin, to obtain the above mentioned gel fraction. However, it is preferable that the above catalyst is not added.

(2) Filling Layer

Next, the filling layer will be explained. As described above, the filling layer is formed of a resin composition different from that of the separable layer, and is not particularly limited as long as it is desirably formed of a resin composition cheaper than that of the separable layer. For example, it is also possible to use resins showing no change of plasticity even when heated at temperatures plasticizing the above mentioned separable layer, for example, cross-linkable resins such as a cross linking agent added EVA.

The thermo-setting resin is not particularly limited as long as its processability is excellent and adhesion to other constituents such as the transparent front face substrate, rear face protecting sheet and the like is excellent. Known thermosetting resins conventionally used as the encapsulant layer can be used. The filling layer can also contain various additives intending an improvement of mechanical strength, prevention of yellowing, and prevention of cracking and the like.

When the separable layer contains a copolymer of a polyethylene for polymerization with an ethylenically unsaturated silane compound as described above, and a polyethylene for addition, it is also possible that the filling layer is formed of a polyethylene. The reason for this is that, in this case, adhesion with the separable layer is excellent, and it is advantageous in view of the cost.

(3) Encapsulant Layer

The thickness of the encapsulant layer for photovoltaic module of the present invention is preferably in a range of 10 to 2000 µm, particularly in a range of 100 to 1250 µm. When thinner than the above mentioned range, a cell cannot be supported and the cell tends to be damaged, and when thicker than the above mentioned range, the weight of the module increases and workability when installing thereof and the like is poor, and disadvantageous in view of the cost, in some cases.

The method for manufacturing the encapsulant layer is not particularly limited. For example, when an encapsulant layer is constituted only of the separable layer, the above mentioned copolymers as the thermoplastic resin can be heat-melted and extrusion-processed. It is also possible that a polyolefin and additives, used if necessary, in addition to the above mentioned copolymer are mixed and placed into a hopper of an extruder, and heat-melted in a cylinder.

The heating temperature in heat-melting is preferably 300° C. or less, more preferably 270° C. or less. The reason for this is, as described above, that the above mentioned copolymer tends to be gelled by cross-linking of a silanol group part by heating.

After heat melting, it can be molded into a sheet having predetermined thickness by existing methods such as T die, inflation and the like, to give an encapsulant layer used in the photovoltaic module of the present invention.

On the other hand, when the encapsulant layer has a multi-structure, it can be manufactured as an integrated molded body is possible by, for example, a lamination method and the like in which the separable layer and the filling layer are previously molded into a sheet, and integrated by vacuum-sucked and the like and thermocompressed as described above.

(4) Photovoltaic Module

A photovoltaic module using the encapsulant layer for photovoltaic module of the present invention as described above is required to have high maintenance factor of conversion efficiency for standing use for a long period of time.

For this reason, in the present invention, (d) an output maintenance factor of photoelectronic power, before and after a test measured based on a standard, of a photovoltaic module is in a range of 80% to 100%, preferably in a range of 90% to 100%, more preferably in a range of 95% to 100%. The reason for this is that when the output maintenance factor of photoelectronic power is in this range, the maintenance factor of conversion efficiency is secured sufficiently.

The output maintenance factor of photoelectronic power before and after a test measured based on a standard of the photovoltaic module is, when the photovoltaic cell is a crystalline element, it is measured by JIS standard C8917 and when the photovoltaic cell is an amorphous element, it is measured by JIS standard C8938, and regarding other photovoltaic cells, the output maintenance factor is measured by a method pursuant to the above.

B. Photovoltaic Module

Hereinafter, the photovoltaic module of the present invention will be described. The photovoltaic module of the present invention is characterized in that the encapsulant layer for photovoltaic module described in the above mentioned "A. Encapsulant layer for photovoltaic module" is used.

Members constituting the photovoltaic module of the present invention will be described below. Since the encapsulant layer is the same as described in the above mentioned "A. Encapsulant layer for photovoltaic module", description thereof is omitted.

(1) Photovoltaic Cell

The photovoltaic cell used in the present invention is not particularly limited as long as it has a function of photoelectronic power, and known elements generally used as the photovoltaic cell can be used. Examples thereof include crystalline silicone photovoltaic cells such as a single crystalline silicon type photovoltaic cell, polycrystalline silicon type photovoltaic cell and the like, amorphous silicone photovoltaic cells of single bonding type or tandem structure type, III-V group compound semiconductor photovoltaic cells such as gallium arsenic (GaAs), indium phosphorus (InP) and the like, II-VI group compound semiconductor photovoltaic cells such as cadmium tellurium (CdTe), copper indium selenite ($CuInSe_2$) and the like.

Further, thin film polycrystalline silicone photovoltaic cells, thin film fine-crystalline silicone photovoltaic cells, hybrid elements of a thin film crystalline silicon photovoltaic cell with an amorphous silicon photovoltaic cell, and the like can also be used.

In these photovoltaic cells, an electromotive part of crystalline silicon of p-n junction structure and the like, amorphous silicon of p-i-n junction structure and the like or compound semiconductor and the like is formed on a substrate such as a glass substrate, plastic substrate, metal substrate and the like.

In the photovoltaic module of the present invention, a plurality of the photovoltaic cells 1 are arranged as shown in FIG. 1. In this mechanism, when this photovoltaic cell 1 is illuminated with solar light, an electron (−) and hole (+) are generated, and electric current flows through wiring electrodes 2 and takeoff electrodes 3 placed in between photovoltaic cells.

(2) Transparent Front Face Substrate

In the present invention, the transparent front face substrate has a function of protecting inside of a module from wind and weather, outer impact, fire and the like and of securing reliability for a long period of time of the photovoltaic module when exposed outdoors.

Such a transparent front face substrate is not particularly limited as long as it has transmittance of solar light, electric insulation property, and is excellent in mechanical, chemical or physical strength, and known substrates generally used as a transparent front face substrate for a photovoltaic module can be used. For example, glass plates, fluorine-based resin sheets, cyclic polyolefin-based resin sheets, polycarbonate-based resin sheets, poly(meth)acrylic based-resin sheets, polyamide-based resin sheets, or polyester-based resin sheets and the like can be listed. Particularly, it is preferable that the glass plates are utilized as the transparent front face substrate in the present invention. The reason for this is that a glass plate is excellent in heat resistance. Therefore, reusing or recycling thereof will be easy since the heating temperature, when constituents are separated from a used photovoltaic module and the encapsulant layer adhered on the surface of the glass plate is removed, can be set sufficiently high.

(3) Rear Face Protecting Sheet

The rear face protecting sheet is a weather-resistant film protecting the rear face of the photovoltaic module from the surrounding. As the rear face protecting sheet used in the photovoltaic module of the present invention, metal plates or metal foils of aluminum and the like, fluorine-based resin sheets, cyclic polyolefin-based resin sheets, polycarbonate-based resin sheets, poly(meth)acrylic-based resin sheets, polyamide-based resin sheets, polyester-based resin sheets, or complex sheets obtained by laminating a weather-resistant film and a barrier film and the like can be listed.

The thickness of the rear face protecting sheet used in the present invention is preferably in a range of from 20 μm to 500 μm, more preferably in a range of 60 μm to 150 μm.

(4) Other Constituent Member

In the present invention, other layers may further be optionally laminated in purpose of improving a solar light absorbing property, reinforcement and other objects, in addition to the above mentioned matters.

After laminating each constituent, an outer frame can also be provided for fixing layers as an integrated molded body. As the outer frame, those formed of the same material as that used for the above mentioned rear face protecting sheet can be used.

(5) Method for Manufacturing Photovoltaic Module

A method for manufacturing such the photovoltaic module of the present invention is not particularly limited, and known methods conventionally used as a method for manufacturing a photovoltaic module can be used. For example, by using usual forming method such as lamination method, in which transparent front face substrate, encapsulant layer, photovoltaic cell, encapsulant layer and rear face protecting sheet are laminated in this order facing to each other, further laminating other constituents if necessary, and then, these integrated by vacuum suction and thermocompressed, and these are molded by thermocompression as an integrated molded body.

In the present invention, laminating temperature, when such a lamination method is used, is preferably in a range of 90° C. to 230° C., particularly preferably in a range of 110° C. to 190° C. When the temperature is lower than the above mentioned range, there is a possibility that sufficient melting is not obtained and close adherence with the transparent front face substrate, auxiliary electrode, photovoltaic cell and rear face protecting sheet and the like may be deteriorated, and when the temperature is higher than the above mentioned range, there is a possibility that water-crosslinking due to water vapor in air tends to progress and gel fraction may be increased, which is not desirable. The laminating time is preferably in a range of 5 to 60 minutes, particularly preferably in a range of 8 to 40 minutes. When time is shorter than the above mentioned range, there is a possibility that sufficient melting is not obtained and close adherence with the above mentioned members may be deteriorated, and when time is longer than the above mentioned range, a process problem may occur, particularly, depending on temperature and humidity conditions, gel fraction may be increased. Regarding humidity, when humidity is too high, gel fraction may be increased, and when humidity is too low, there is a possibility of decrease in close adherence with various members, however, at humidity under usual atmospheric environment, no particularly problems will occur.

It is also possible that two or more layers are previously integrated by a lamination method and the like. For example, integrated layers of the transparent front face substrate and the encapsulant layer, or the encapsulant layer and the rear face protecting sheet may be used.

For enhancing adhesion between layers, adhesives such as heat melting type adhesives, photo-curing type adhesives and the like formed mainly of a vehicle such as a (meth) acrylic resin, olefin-based resin, vinyl-based resin and the like can be used if necessary.

Further, respective facing surfaces between laminates can be subjected to a pre-treatment such as a corona discharge treatment, ozone treatment, low temperature plasma treatment using an oxygen gas, nitrogen gas and the like, glow discharge treatment, oxidation treatment using chemicals and the like.

It is also possible that a primer coat agent layer, under coat agent layer, adhesive layer or anchor coat agent layer and the like is previously formed on respective facing surfaces between laminates and a surface pre-treatment may be conducted.

An outer frame for fixing an integrated body obtained by laminating these layers can be mounted after lamination of layers and before adhering under thermocompression, or may also be mounted after adhering under thermocompression.

C. Method for Manufacturing Regenerated Photovoltaic Cell

Next, the method for manufacturing a regenerated photovoltaic cell of the present invention will be explained below.

The method for manufacturing a regenerated photovoltaic cell of the present invention is a method for manufacturing a regenerated photovoltaic cell, wherein a regenerated photovoltaic cell is obtained from the above mentioned photovoltaic module, comprising:

a heating process of heating the photovoltaic module at temperatures not lower than the softening temperature of a thermoplastic resin which is a constituent material of the separable layer;

a separating process of peeling the separable layer, plasticized by heating, to separate the photovoltaic cell; and a removing process of removing the encapsulant layer adhered to the photovoltaic cell. These each process will be described below.

1. Heating Process

In the heating process, the photovoltaic module is heated at temperatures not lower than the softening temperature of the thermoplastic resin which is a constituent material of the separable layer. By heating at temperatures not lower than the softening temperature of the thermoplastic resin, the plasticity of a thermoplastic resin which is a constituent material of the separable layer changes, and the separable layer can be easily peeled.

As the heating method, a method in which the photovoltaic module is placed in a vessel filled with a heated gas, liquid or solid such as a powder and the like or a combination thereof, a method in which the photovoltaic module is retained on a heated hot plate, and the like can be listed.

The heating temperature is a temperature not lower than the softening temperature of the thermoplastic resin which is a constituent material of the separable layer, and appropriately selected depending on the thermoplastic resin used. Here, the softening temperature means a Vicat softening temperature measured based on JIS standard K7206 of the above mentioned thermoplastic resin. The heating temperature in the heating process is the same as this Vicat softening temperature or higher than the Vicat softening temperature preferably by 0 to 390° C., more preferably by 10 to 290° C., further preferably by 20 to 140° C.

The specific heating temperature in the above mentioned heating process is preferably in a range of 60 to 450° C., more preferably in a range of 70 to 350° C., further preferably in a range of 80 to 200° C.

2. Separating Process

In the separating process in the present invention, the separable layer plasticized by heating in the above mentioned heating process is peeled to separate the photovoltaic cell. The photovoltaic cell may be separated by any method as long as it is separated without being damaged.

As the separating method, a method using a separating means, a method applying shear stress, and the like can be listed.

Figure 2:
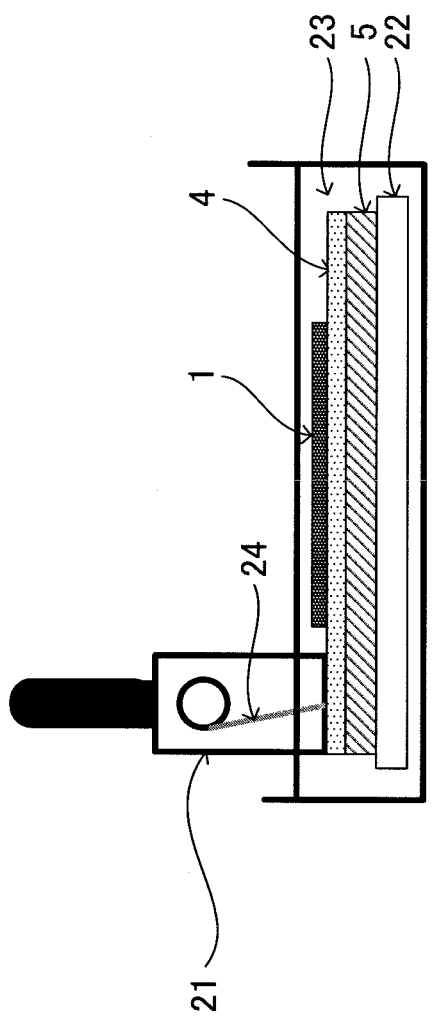
FIG. 2 is a schematic sectional view showing one example of the separation device used in a method for manufacturing regenerated photovoltaic cell of the present invention.
Figure 3:
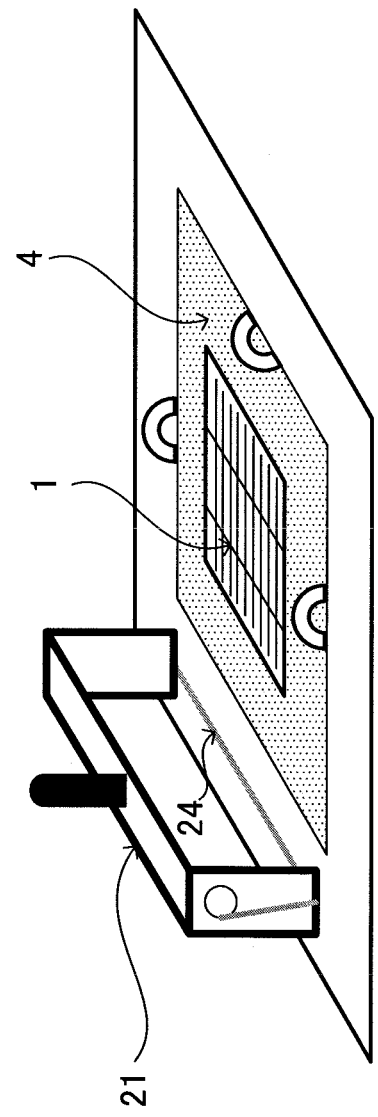
FIG. 3 is a diagrammatic perspective vies showing one example of the separation device used in a method for manufacturing regenerated photovoltaic cell of the present invention.

The method using a separating means is a method in which the encapsulant layer placed in between the transparent front face substrate and the photovoltaic cell, and the encapsulant layer placed in between the photovoltaic cell and the rear face protecting sheet, of the photovoltaic module heated in the above mentioned heating process, are cut by making a separating means go through them, to separate the transparent front face substrate and the rear face protecting sheet from the photovoltaic cell. And such a separating means is not particularly limited as long as it can cut the encapsulant layer in softened condition, and wire and the like can be listed as preferable examples. The separating means using wire will be explained referring to a drawing. For example, as shown in FIG. 2, By using separation device comprising a jig 21 for fixed wire, a jig 22 for fixing module, and an oil bath 23, a photovoltaic cell 1 and encapsulant layer 4 are separated by cutting of wire 24. Also, FIG. 3 is a diagrammatic perspective view of the separation device.

The method for applying shearing force is a method in which at least one of the photovoltaic cell of a photovoltaic module heated in the above mentioned heating process and the transparent front face substrate, or at least one of the photovoltaic cell and the rear face protecting sheet, is pushed toward transverse direction to apply shearing force to the encapsulant layer. Thereby, the transparent front face substrate and the rear face protecting sheet are separated from the photovoltaic cell.

3. Removing Process

In the removing process of the present invention, the encapsulant layer adhered to the photovoltaic cell is removed. As this removing method, physical cleaning of physically removing the encapsulant layer, chemical cleaning of chemically removing the encapsulant layer, a combination thereof and the like can be listed. Further, the encapsulant layer may be removed by a method of combination of a plurality of chemical cleaning methods, combination of a plurality of physical cleaning methods, further, combination thereof.

As the above mentioned physical cleaning, a method in which a gas, liquid or solid or a combination thereof is sprayed, a method of wiping with cloth and the like can be listed. The physical cleaning is preferably conducted under heating of the encapsulant layer. For example, an air blast method and a shot blast method, in which steel sphere shots are sprayed at high speed using compressed air or centrifugal force in a heated atmosphere and the like can be listed. When an adhered substance is a part corresponding to the separable layer, physical cleaning is useful.

In this physical cleaning, it is necessary to remove an adhered substance so that the regenerated photovoltaic cell is not damaged. Therefore, for example, when the encapsulant layer is removed by spraying fine particles, the particle size of fine particles is preferably in a range of 5 μm to 500 μm. For example, as solid which can be used for physical cleaning, steel-based abrasive materials, stainless abrasive materials, zinc abrasive materials, copper abrasive materials, alumina abrasive materials, silicon carbide abrasive materials, glass abrasive materials, resin abrasive materials, silica sand, ceramic beads, zirconia, slag, calcium carbonate, sodium bicarbonate and the like can be listed.

As the liquid, for example, heated organic solvents, metal liquid and the like can be listed.

As the gas, air, inert gases such as nitrogen gas, argon gas, helium gas and the like can be listed.

As the chemical cleaning, a method of treating with an acid or alkali, a method of eluting by a solvent and the like, can be listed. The solvent which can be used for chemical cleaning can be appropriately selected depending on the encapsulant layer adhered.

Specifically, a method in which the separated photovoltaic cell is immersed in an organic solvent such as xylene and the like, and the separable layer is removed from the surface of the photovoltaic cell, and other methods can be listed. There are cases where an organic solvent such as xylene and the like is heated or refluxed.

There are also a method in which stearic acid is poured onto the separated photovoltaic cell under heated condition, and the separable layer is removed, and other methods.

There are also a method in which stearic acid is poured onto the separated photovoltaic cell under heated condition, and the encapsulant layer is removed to a certain extent, then, the photovoltaic cell carrying the remaining encapsulant layer on its surface is immersed in an organic solvent such as xylene and the like, and the encapsulant layer remaining on the surface of the photovoltaic cell is peeled, and other methods. There are cases where an organic solvent such as xylene and the like is heated or refluxed.

Further, a method can also be listed, in which the separated photovoltaic cell is immersed in an organic solvent such as xylene and the like, the encapsulant layer is removed from the surface of the photovoltaic cell to a certain extent, then, the photovoltaic cell carrying the remaining encapsulant layer on its surface is taken out, stearic acid is poured onto, this under heated condition, and the encapsulant layer remaining on the surface of the photovoltaic cell is peeled, and other methods. There are cases where an organic solvent such as xylene and the like is heated or refluxed.

As the method of combining physical cleaning with chemical cleaning, for example, methods can be listed, in which an adhered substance is immersed to a certain extent in liquid for dissolution, then, the adhered substance is completely removed by an air blast method or shot blast method and the like.

As described above, the adhered substance can be removed, and if necessary, by cleaning with alcohol and the like, a regenerated photovoltaic cell can be easily manufactured from a used photovoltaic module.

The above mentioned method for manufacturing a regenerated photovoltaic cell can be applied to a case of recovering other constituents such as the transparent front face substrate and the like from the photovoltaic module. For example, when recovering a surface glass used as a transparent front face substrate, it can be reused as a photovoltaic module surface glass if the adhered substance can be completely removed. When an adhered substance cannot be completely removed or surface glass is broken, it can be recycled as other material by heat melting and the like. In this case, the adhering amount to the surface glass is smaller as compared with conventional technologies, therefore, recycle cost can be decreased.

D. Method for Manufacturing Regenerated Transparent Front Face Substrate

The method for manufacturing a regenerated transparent front face substrate of the present invention is a method for manufacturing a regenerated transparent front face substrate, wherein a regenerated transparent front face substrate is obtained from the above mentioned photovoltaic module, comprising:

a heating process of heating the photovoltaic module at temperatures not lower than the softening temperature of a thermoplastic resin which is a constituent material of the separable layer;

a separating process of peeling the separable layer, plasticized by heating, to separate the transparent front face substrate; and a removing process of removing the encapsulant layer adhered to the transparent front face substrate. The each process will be explained below.

1. Heating Process

In the heating process, by heating the photovoltaic module at temperatures not lower than the softening temperature of the thermoplastic resin which is a constituent material of the separable layer, the separable layer can be easily peeled. The heating method and heating temperature are the same as described in the column of "C. Method for manufacturing regenerated photovoltaic cell", therefore, description thereof is omitted.

2. Separating Process

In the separating process, the separable layer plasticized by heating in the above mentioned heating process is peeled to separate the transparent front face substrate. The separating method is not particularly limited as long as the transparent front face substrate is not damaged.

Specifically, methods of using a separating means, method of applying shearing stress and the like described in the above mentioned column of "C. Method for manufacturing regenerated photovoltaic cell" can be listed.

3. Removing Process

In the removing process, the encapsulant layer adhered to the transparent front face substrate is removed. The removing method can be carried out by physical cleaning, chemical cleaning or a combination thereof like in the column of "C. Method for manufacturing regenerated photovoltaic cell". Specifically, since these are the same as described above, description thereof is omitted.

After removal of the encapsulant layer, if necessary, cleaning with alcohol and the like is conducted. And the regenerated transparent front face substrate can be easily manufactured from the used photovoltaic module.

E. Method for Reutilizing Photovoltaic Module

Finally, the method for reutilizing a photovoltaic module of the present invention will be explained. The method for reutilizing a photovoltaic module of the present invention is a method for reutilizing a photovoltaic module in which a member is reutilized from the photovoltaic module described in the column of "B. Photovoltaic module", comprising:

a heating process of heating the photovoltaic module at temperatures not lower than the softening temperature of a thermoplastic resin which is a constituent material of the separable layer; and a separating process of peeling the separable layer plasticized by heating to separate the transparent front face substrate.

In the method for reutilizing the photovoltaic module of the present invention, for example, members such as a photovoltaic cell contained in the photovoltaic module, which is determined to be defective in processing a photovoltaic module, or members such as the photovoltaic cell of the photovoltaic module recovered after use, and the like can be reutilized (recycle or reuse), this being advantageous from the standpoint of cost, additionally, being suitable in view of global environments.

As the photovoltaic module subjected to the method for reutilizing the photovoltaic module of the present invention, as described above, the photovoltaic module determined to be defective in the process of manufacturing the photovoltaic module, and the photovoltaic module recovered after use can be listed.

In the present invention, a heating process and separating process are performed on such the photovoltaic module, and these heating process and separating process are the same as described in the above mentioned "C. Method for manufacturing regenerated photovoltaic cell" or the above mentioned "D. Method for manufacturing regenerated transparent front face substrate", therefore, description thereof is omitted.

In the present invention, it is preferable that the rear face protecting sheet separating process is conducted simultaneously in the above mentioned separating process.

The reason for this is that, for example, when a material generating a harmful gas by heating such as a fluorine-based resin and the like is used as the rear face protecting sheet, by separating the rear face protecting sheet from the photovoltaic module in the rear face protecting sheet separating process, generation of a harmful gas by heating the rear face protecting sheet when reutilizing the photovoltaic module can be prevented, consequently, environmental load can be reduced.

Separation of the rear face protecting sheet may be conducted simultaneously with separation of the above mentioned photovoltaic cell or transparent front face substrate, or may be conducted before separation of these members.

In the present invention, the treatment after the separating process differs depending on whether the member is used as it is (reuse) or the member is used as a material (recycle). In the case of reusing, when the member is, for example, the photovoltaic cell or transparent front face substrate, the members is reused by the treating methods described in the above mentioned "C. Method for manufacturing regenerated photovoltaic cell" or the above mentioned "D. Method for manufacturing regenerated transparent front face substrate". On the other hand, in the case of recycling, the member is recycled by a recycling method described later.

Thus, there are a case in which whether the members are reused or recycled is determined at a stage of the photovoltaic module, and a case in which it is determined after the above mentioned separating process, depending on the state of the member constituting the photovoltaic module such as photovoltaic cell, transparent front face substrate and the like.
(Recycling Method)

In the method for reutilizing the photovoltaic module of the present invention, a method for recycling the photovoltaic cell and transparent front face substrate, among the members of the photovoltaic module, will be explained.
1. Photovoltaic Cell When the element is damaged or the like, after the separating process, the element is recycled for uses other than the photovoltaic cell, with or without conducting the above mentioned removing process.

Specifically, the member is re-melted to reform a Si ingot and recycled, or when impurities are contained in large proportion in Si, the member is used for other uses.
2. Transparent Front Face Substrate Also in this case, the member is used for uses other than the transparent front face substrate, with or without conducting the above mentioned removing process, after the separating process. Specifically, by a method such as, the member is recovered as a glass raw material (cullet) and melted to reform a plate glass.

The present invention is not limited to the above mentioned embodiments. The above mentioned embodiments are only example, and any embodiments having substantially the same constitution as the technological idea described in claims of the present invention and performing the same action effect are included in the technological range of the present invention.

EXAMPLES

The following examples will further illustrate the present invention specifically.

Example 1

(1) Production of Encapsulant Layer 100 parts by weight of a straight chain low density polyethylene having a Vicat softening temperature, measured based on JIS standard K7206 (hereinafter, referred to as Vicat softening temperature), of 80° C., a melting temperature of 90° C., a melt mass flow rate (hereinafter, referred to as MFR) of 2 g/10 min at 190° C. and a density of 0.898 g/cm$^3$, 2.0 parts by weight of vinyltrimethoxysilane and 0.1 part by weight of a free radical generator (t-butyl-peroxy isobutyrate) were mixed and graft-polymerized at a melt stirring temperature of 200° C. to cause silane modification, manufacturing a silane-modified straight chain low density polyethylene.

3.75 parts by weight of a hindered amine-based photo-stabilizer, 3.75 parts by weight of a benzotriazole-based ultraviolet absorber and 0.5 parts by weight of a phosphorus-based thermal-stabilizer were mixed based in 100 parts by weight of the straight chain low density polyethylene and they were melt-processed to obtain a master batch.

To 20 parts by weight of the above mentioned silane-modified straight chain low density polyethylene having a silane modification ratio of 0.3%, 80 parts by weight of a straight chain low density polyethylene having a Vicat softening temperature of 70° C., a melting temperature of 90° C., a MFR of 3.5 g/10 min at 190° C. and a density of 0.900 g/cm$^3$ and 5 parts by weight of the above mentioned master batch were added and mixed. And by using a film molding machine having a 150 mφ extruder and a 1000 width T dice, formed a film having a thickness of 400 μm at a resin temperature of 230° C. and a casting speed of 4 m/min.

Film formation could be conducted without problems. The appearance and total ray transmittance of the resulting film were excellent. The polymerized Si amount of the resulting film was 60.0 ppm.
(2) Manufacture of Photovoltaic Module The resulting film was used as an encapsulant layer, laminating a glass plate having a thickness of 3 mm (transparent front face substrate), an encapsulant layer having a thickness of 400 μm, a photovoltaic cell formed of polycrystalline silicon, an encapsulant layer having a thickness of 400 μm and a laminated sheet composed of a polyvinyl fluoride-based resin sheet (PVF) having a thickness of 38 μm, aluminum foil having a thickness of 30 μm and a polyvinyl fluoride-based resin sheet (PVF) having a thickness of 38 μm as, a rear face protecting sheet, in this order, the photovoltaic module of the present invention was manufactured by adhering under press at 150° C. for 15 minutes in a vacuum laminator for production of a photovoltaic module, with the surface of the photovoltaic cell facing up. The encapsulant layer was cut out from the resulting photovoltaic module and its gel fraction was measured to be 0%.

Example 2

The same silane-modified straight chain low density polyethylene as in Example 1 was manufactured, and the same master batch as in Example 1 was manufactured.

100 parts by weight of the above mentioned silane-modified straight chain low density polyethylene and 5 parts by weight of the above mentioned master batch were mixed, and a film of 400 μm was formed in the same manner as in Example 1.

Film formation could be conducted without problems. The appearance and total ray transmittance of the resulting film were excellent. The polymerized Si amount in the resulting film was 3000 ppm.

A photovoltaic module was manufactured in the same manner as in Example 1. The encapsulant layer was cut out from the resulting photovoltaic module, and its gel fraction was measured to be 0%.

Example 3

The same silane-modified straight chain low density polyethylene as in Example 1 was manufactured, and the same master batch as in Example 1 was manufactured.

1. Separable Layer (Outer Layer)

To 20 parts by weight of the above mentioned silane-modified straight chain low density polyethylene, 80 parts by weight of a straight chain low density polyethylene having a Vicat softening temperature of 70° C., a melting temperature of 90° C., a MFR of 3.5 g/10 min at 190° C. and a density of 0.900 g/cm$^3$ and 5 parts by weight of the above mentioned master batch were added and mixed.

2. Filling Layer (Inner Layer)

A straight chain low density polyethylene, having a Vicat softening temperature of 75° C., a melting temperature of 100° C., a MFR of 3.5 g/10 min at 190° C. and a density of 0.902 g/cm$^3$, was used.

The above mentioned separable layer and filling layer were laminated in the order of separable layer, filling layer and separable layer. The film thickness ratio was 1:6:1. In manufacturing, a film molding machine having a 150 mmφ, 50 mmφ multi-layered extruder and a 1000 width T dice was used, and a multi-layered film having a thickness of 400 μm was formed at a resin temperature of 230° C. and a casting speed of 4 m/min.

Film formation could be conducted without problems. The appearance and total ray transmittance of the resulting film were excellent. The polymerized Si amount in the resulting separable layer was 600 ppm.

A photovoltaic module was manufactured in the same manner as in Example 1. The encapsulant layer was cut out from the resulting photovoltaic module, and its gel fraction was measured to be 0%.

Example 4

The same silane-modified straight chain low density polyethylene as in Example 1 was manufactured, and the same master batch as in Example 1 was manufactured.

1. Separable Layer (Outer Layer)

100 parts by weight of the above mentioned silane-modified straight chain low density polyethylene and 5 parts by weight of the above mentioned master batch were added and mixed.

2. Filling Layer (Inner Layer)

The same filling layer as in Example 3 was used.

A multi-layered film was formed in the same manner as in Example 3.

Film formation could be conducted without problems. The appearance and total ray transmittance of the resulting film were excellent. The polymerized Si amount in the resulting separable layer was 3000 ppm.

A photovoltaic module was manufactured in the same manner as in Example 1. The encapsulant layer was cut out from the resulting photovoltaic module, and its gel fraction was measured to be 0%.

Example 5

The same silane-modified straight chain low density polyethylene as in Example 1 was manufactured, and the same master batch as in Example 1 was manufactured.

1. Separable Layer (Outer Layer)

The same separable layer as in Example 3 was used.

2. Filling Layer (Inner Layer)

100 parts by weight of a straight chain low density polyethylene having a Vicat softening temperature of 75° C., a melting temperature of 100° C., a MFR of 3.5 g/10 min at 190° C. and a density of 0.902 g/cm$^3$ and 5 parts by weight of the above mentioned master batch were added and mixed.

A multi-layered film was formed in the same manner as in Example 3.

Film formation could be conducted without problems. The appearance and total ray transmittance of the resulting film were excellent. The polymerized Si amount in the resulting separable layer was 600 ppm.

A photovoltaic module was manufactured in the same manner as in Example 1. The encapsulant layer was cut out from the resulting photovoltaic module, and its gel fraction was measured to be 0%.

Example 6

The same silane-modified straight chain low density polyethylene as in Example 1 was manufactured, and the same master batch as in Example 1 was manufactured.

1. Separable Layer (Outer Layer)

The same separable layer as in Example 3 was used.

2. Filling Layer (Inner Layer)

To 5 parts by weight of the above mentioned silane-modified straight chain low density polyethylene, 95 parts by weight of a straight chain low density polyethylene having a Vicat softening temperature of 75° C., a melting temperature of 100° C., a MFR of 3.5 g/10 min at 190° C. and a density of 0.902 g/cm$^3$ and 5 parts by weight of the above mentioned master batch were added and mixed.

A multi-layered film was formed in the same manner as in Example 3.

Film formation could be conducted without problems. The appearance and total ray transmittance of the resulting film were excellent. The polymerized Si amount in the resulting separable layer was 600 ppm.

A photovoltaic module was manufactured in the same manner as in Example 1. The encapsulant layer was cut out from the resulting photovoltaic module, and its gel fraction was measured to be 0%.

Example 7

The same silane-modified straight chain low density polyethylene as in Example 1 was manufactured, and the same master batch as in Example 1 was manufactured.

1. Separable Layer (Outer Layer)

A film having a thickness of 50 μm was manufactured in the same manner as in Example 1.

2. Filling Layer (Inner Layer)

An ethylene-vinyl acetate copolymer sheet having a thickness of 300 μm was used.

Laminating a glass plate having a thickness of 3 mm (transparent front face substrate), the above mentioned separable layer having a thickness of 50 μm, an ethylene-vinyl acetate copolymer sheet having a thickness of 300 μm, the above mentioned separable layer having a thickness of 50 μm, the photovoltaic cell formed of polycrystalline silicon, the above mentioned separable layer having a thickness of 50 μm, an ethylene-vinyl acetate copolymer sheet having a thickness of 300 μm, the above mentioned separable layer having a thickness of 50 μm, and a laminated sheet composed of a polyvinyl fluoride-based resin sheet (PVF) having a thickness of 38 μm, aluminum foil having a thickness of 30 μm and a polyvinyl fluoride-based resin sheet (PVF) having a thickness of 38 μm, as a rear face protecting sheet, in this order, and the photovoltaic module of the present invention was manufactured by adhering under press at 150° C. for 15 minutes in a vacuum laminator and heating at 150° C. for 15 minutes in a oven for production of a photovoltaic module with the surface of the photovoltaic cell facing up. The separable layer was cut out from the resulting photovoltaic module, and its gel fraction was measured to be 0%.

Example 8

(1) Manufacture of Encapsulant Layer 100 parts by weight of the same straight chain low density polyethylene as in Example 1, 0.005 parts by weight of vinyltrimethoxysilane and 0.1 parts by weight of a free radical generator (t-butyl-peroxy isobutyrate) were mixed and graft-polymerized at a melt stirring temperature of 200° C. to cause silane modification, manufacturing a silane-modified straight chain low density polyethylene.

To 100 parts by weight of the above mentioned silane-modified straight chain low density polyethylene, 5 parts by weight of the same master batch as in Example 1 was added and mixed, and formed into a film having a thickness of 400 μm by using a film molding machine having a 150 mmφ extruder and a 1000 width T dice at a resin temperature of 230° C. and a casting speed of 4 m/min.

Film formation could be conducted without problems. The appearance and total ray transmittance of the resulting film were excellent. The polymerized Si amount in the resulting film was 8 ppm.

(2) Manufacture of Photovoltaic Module

The resulting film was used as an encapsulant layer, and the same transparent front face substrate, photovoltaic cell and rear face protecting sheet as in Example 1 were laminated in the same manner as in Example 1, and adhered under press at 90° C. for 5 minutes in a vacuum laminator for manufacture a photovoltaic module with the surface of the photovoltaic cell facing up, manufacturing the photovoltaic module of the present invention. The encapsulant sample was cut out from the resulting photovoltaic module, and its gel fraction was measured to be 0%.

Example 9

(1) Manufacture of Encapsulant Layer

To 100 parts by weight of the same silane-modified straight chain low density polyethylene as in Example 1, 5 parts by weight of the same master batch as in Example 1 was added and mixed, and formed into a film having a thickness of 400 μm by using a film molding machine having a 150 mmφ extruder and a 1000 width T dice at a resin temperature of 230° C. and a casting speed of 4 m/min.

Film formation could be conducted without problems. The appearance and total ray transmittance of the resulting film were excellent. The polymerized Si amount in the resulting film was 3000 ppm.

(2) Manufacture of Photovoltaic Module

The resulting film was used as an encapsulant layer, and the same transparent front face substrate, photovoltaic cell and rear face protecting sheet as in Example 1 were laminated in the same manner as in Example 1, and adhered under press at 190° C. for 90 minutes in a vacuum laminator for production of a photovoltaic module with the surface of the photovoltaic cell facing up, manufacturing a photovoltaic module of the present invention. The encapsulant sample was cut out from the resulting photovoltaic module and its gel fraction was measured to be 15%.

Example 10

(1) Manufacture of Encapsulant Layer 100 parts by weight of a straight chain low density polyethylene having a Vicat softening temperature of 60° C., a melting temperature of 70° C., a MFR of 15 g/10 min at 190° C. and a density of 0.865 g/cm$^3$, 2.0 parts by weight of vinyltrimethoxysilane and 0.1 parts by weight of a free radical generator (t-butyl-peroxy isobutyrate) were mixed and graft-polymerized at a melt stirring temperature of 170° C. to cause silane modification, manufacturing a silane-modified straight chain low density polyethylene.

To 100 parts by weight of the above mentioned silane-modified straight chain low density polyethylene, 5 parts by weight of the same master batch as in Example 1 was added and mixed, and formed into a film in the same manner as in Example 1.

Film formation could be conducted without problems. The appearance and total ray transmittance of the resulting film were excellent. The polymerized Si amount in the resulting film was 3000 ppm.

(2) Manufacture of Photovoltaic Module

The resulting film was used as an encapsulant layer, and the same transparent front face substrate, photovoltaic cell and rear face protecting sheet as in Example 1 were laminated in the same manner as in Example 1, and adhered under press at 90° C. for 15 minutes in a vacuum laminator for production of a photovoltaic module with the surface of the photovoltaic cell facing up, manufacturing a photovoltaic module of the present invention. The encapsulant sample was cut out from the resulting photovoltaic module and its gel fraction was measured to be 0%.

Example 11

(1) Manufacture of Encapsulant Layer 100 parts by weight of a high density polyethylene having a Vicat softening temperature of 127° C., a melting temperature of 135° C., a MFR of 5 g/10 min at 190° C. and a density of 0.950 g/cm$^3$, 2.0 parts by weight of vinyltrimethoxysilane and 0.1 part by weight of a free radical generator (t-butyl-peroxy isobutyrate) were mixed and graft-polymerized at a melt stirring temperature of 300° C., manufacturing a silane-modified straight chain low density polyethylene.

To 100 parts by weight of the above mentioned silane-modified straight chain low density polyethylene, 5 parts by weight of the same master batch as in Example 1 was added and mixed, and formed into a film having a thickness of 400 μm by using a film molding machine having a 150 mmφ extruder and a 1000 width T dice at a resin temperature of 300° C. and a casting speed of 4 m/min.

Film formation could be conducted without problems. The appearance of the resulting film was excellent. The polymerized Si amount in the resulting film was 3000 ppm.

(2) Manufacture of Photovoltaic Module

The resulting film was used as an encapsulant layer, and the same transparent front face substrate, photovoltaic cell and rear face protecting sheet as in Example 1 were laminated in the same manner as in Example 1, and adhered under press at 230° C. for 15 minutes in a vacuum laminator for production of a photovoltaic module with the surface of the photovoltaic cell facing up, manufacturing a photovoltaic module of the present invention. The encapsulant sample was cut out from the resulting photovoltaic module and its gel fraction was measured to be 0%.

Example 12

(1) Manufacture of Encapsulant Layer 100 parts by weight of a straight chain low density polyethylene having a Vicat softening temperature of 80° C., a melting temperature of 90° C., a MFR of 0.1 g/10 min at 190° C. and a density of 0.900 g/cm$^3$, 2.0 parts by weight of vinyltrimethoxysilane and 0.1 part by weight of a free radical generator (t-butyl-peroxy isobutyrate) were mixed and graft-polymerized at a melt stirring temperature of 200° C. to cause silane modification, manufacturing a silane-modified straight chain low density polyethylene.

To 100 parts by weight of the above mentioned silane-modified straight chain low density polyethylene, 5 parts by weight of the same master batch as in Example 1 was added and mixed, and formed into a film having a thickness of 400 μm by using a film molding machine having a 150 mmφ extruder and a 1000 width T dice at a resin temperature of 250° C. and a casting speed of 4 m/min.

Film formation could be conducted without problems. The appearance and total ray transmittance of the resulting film were excellent. The polymerized Si amount in the resulting film was 3000 ppm.

(2) Manufacture of Photovoltaic Module

The resulting film was used as an encapsulant layer, and the same transparent front face substrate, photovoltaic cell and rear face protecting sheet as in Example 1 were laminated in the same manner as in Example 1, and adhered under press at 150° C. for 60 minutes in a vacuum laminator for production of a photovoltaic module with the surface of the photovoltaic cell facing up, manufacturing a photovoltaic module of the present invention. The encapsulant sample was cut out from the resulting photovoltaic module and its gel fraction was measured to be 0%.

Example 13

(1) Manufacture of Encapsulant Layer 100 parts by weight of a straight chain low density polyethylene having a Vicat softening temperature of 80° C., a melting temperature of 90° C., a MFR of 50 g/10 min at 190° C. and a density of 0.880 g/cm$^3$, 2.0 parts by weight of vinyltrimethoxysilane and 0.1 part by weight of a free radical generator (t-butyl-peroxy isobutyrate) were mixed and graft-polymerized at a melt stirring temperature of 200° C., manufacturing a silane-modified straight chain low density polyethylene.

To 100 parts by weight of the above mentioned silane-modified straight chain low density polyethylene, 5 parts by weight of the same master batch as in Example 1 was added and mixed, and formed into a film having a thickness of 400 by using a film molding machine having a 150 mmφ extruder and a 1000 width T dice at a resin temperature of 190° C. and a casting speed of 15 m/min.

Film formation could be conducted without problems. The appearance and total ray transmittance of the resulting film were excellent. The polymerized Si amount in the resulting film was 3000 ppm.

(2) Manufacture of Photovoltaic Module

The resulting film was used as an encapsulant layer, and the same transparent front face substrate, photovoltaic cell and rear face protecting sheet as in Example 1 were laminated in the same manner as in Example 1, and adhered under press at 110° C. for 30 minutes in a vacuum laminator for production of a photovoltaic module with the surface of the photovoltaic cell facing up, manufacturing a photovoltaic module of the present invention. The encapsulant sample was cut out from the resulting photovoltaic module and its gel fraction was measured to be 0%.

Example 14

(1) Manufacture of Encapsulant Layer 100 parts by weight of a straight chain low density polyethylene having a Vicat softening temperature of 80° C., a melting temperature of 90° C., a MFR of 2 g/10 min at 190° C. and a density of 0.898 g/cm$^3$, 3.0 parts by weight of vinyltrimethoxysilane and 0.1 parts by weight of a free radical generator (t-butyl-peroxy isobutyrate) were mixed and graft-polymerized at a melt stirring temperature of 200° C., manufacturing a silane-modified straight chain low density polyethylene.

To 100 parts by weight of the above mentioned silane-modified straight chain low density polyethylene, 0.01 parts by weight of a straight chain low density polyethylene having a Vicat softening temperature of 70° C., a melting temperature of 90° C., a MFR of 3.5 g/10 min at 190° C. and a density of 0.900 g/cm$^3$ and 5 parts by weight of the same master batch as in Example 1 were added and mixed, and formed into a film having a thickness of 400 μm by using a film molding machine having a 150 mmφ extruder and a 1000 width T dice at a resin temperature of 230° C. and a casting speed of 4 m/min.

Film formation could be conducted without problems. The appearance and total ray transmittance of the resulting film were excellent. The polymerized Si amount in the resulting film was 3500 ppm.

(2) Manufacture of Photovoltaic Module

The resulting film was used as an encapsulant layer, and a photovoltaic module of the present invention was manufactured in the same manner as in Example 1. The encapsulant sample was cut out from the resulting photovoltaic module and its gel fraction was measured to be 0%.

Example 15

(1) Manufacture of Encapsulant Layer

A film having a polymerized Si amount of 3500 ppm was manufactured in the same manner as in Example 14.

(2) Manufacture of Photovoltaic Module

The resulting film was used as an encapsulant layer, and the same transparent front face substrate, photovoltaic cell and rear face protecting sheet as in Example 1 were laminated in the same manner as in Example 1, and adhered under press at 230° C. for 60 minutes in a vacuum laminator for production of a photovoltaic module with the surface of the photovoltaic cell facing up, manufacturing a photovoltaic module of the present invention. The encapsulant sample was cut out from the resulting photovoltaic module and its gel fraction was measured to be 30%.

Example 16

(1) Manufacture of Encapsulant Layer

To 20 parts by weight of the same silane-modified straight chain low density polyethylene as in Example 1, 80 parts by weight of the same straight chain low density polyethylene as in Example 1 and 5 parts by weight of the same master batch as in Example 1 were added and mixed, and formed into a film having a thickness of 10 μm by using a film molding machine having a 150 mmφ extruder and a 1000 width T dice at a resin temperature of 230° C. and a casting speed of 18 m/min.

Film formation could be conducted without problems. The appearance and total ray transmittance of the resulting film were excellent. The polymerized Si amount in the resulting film was 600 ppm.

(2) Manufacture of Photovoltaic Module

The resulting film was used as an encapsulant layer, and a photovoltaic module of the present invention was manufactured in the same manner as in Example 1. The encapsulant sample was cut out from the resulting photovoltaic module and its gel fraction was measured to be 0%.

Example 17

(1) Manufacture of Encapsulant Layer

To 20 parts by weight of the same silane-modified straight chain low density polyethylene as in Example 1, 80 parts by weight of the same straight chain low density polyethylene as in Example 1 and 5 parts by weight of the same master batch as in Example 1 were added and mixed, and formed into a film having a thickness of 2000 μm by using a film molding machine having a 150 mmφ extruder and a 1000 width T dice at a resin temperature of 230° C. and a casting speed of 1 m/min.

Film formation could be conducted without problems. The appearance and total ray transmittance of the resulting film were excellent. The polymerized Si amount in the resulting film was 600 ppm.

(2) Manufacture of Photovoltaic Module

The resulting film was used as an encapsulant layer, and a photovoltaic module of the present invention was manufactured in the same manner as in Example 1. The encapsulant sample was cut out from the resulting photovoltaic module and its gel fraction was measured to be 0%.

Example 18

(1) Manufacture of Encapsulant Layer

To 100 parts by weight of the same silane-modified straight chain low density polyethylene as in Example 1, 9900 parts by weight of the same straight chain low density polyethylene as in Example 1 and 5 parts by weight of the same master batch as in Example 1 were added and mixed, and formed into a film in the same manner as in Example 1.

Film formation could be conducted without problems. The appearance and total ray transmittance of the resulting film were excellent. The polymerized Si amount in the resulting film was 30 ppm.

(2) Manufacture of Photovoltaic Module

The resulting film was used as an encapsulant layer, and a photovoltaic module of the present invention was manufactured in the same manner as in Example 1. The encapsulant sample was cut out from the resulting photovoltaic module and its gel fraction was measured to be 0%.

Comparative Example 1

The same procedure as in Example 1 was conducted excepting that a silane-modified straight chain low density polyethylene was not used.

Comparative Example 2

A glass plate having a thickness of 3 mm was used as a transparent front face substrate for a photovoltaic module, and on one surface thereof, an ethylene-vinyl acetate copolymer sheet having a thickness of 400 μm, a photovoltaic cell formed of polycrystalline silicon, an ethylene-vinyl acetate copolymer sheet having a thickness of 400 μm, and a laminated sheet composed of a polyvinyl fluoride-based resin sheet (PVF) having a thickness of 38 μm, aluminum foil having a thickness of 30 μm and a polyvinyl fluoride-based resin sheet (PVF) having a thickness of 38 μm as a rear face protecting sheet, were laminated and adhered under press at 150° C. for 15 minutes in a laminator for production of a photovoltaic module with the surface of the photovoltaic cell facing up, then, heated in an oven of 150° C. for 15 minutes, to manufacture a photovoltaic module.

The encapsulant sample was cut out from the resulting photovoltaic module and its gel fraction was measured to be 94%.

Comparative Example 3

(1) Manufacture of Encapsulant Layer 100 parts by weight of the same straight chain low density polyethylene as in Example 1, 0.0007 parts by weight of vinyltrimethoxysilane and 0.1 parts by weight of a free radical generator (t-butyl-peroxy isobutyrate) were mixed and graft-polymerized at a melt stirring temperature of 200° C., manufacturing a silane-modified straight chain low density polyethylene.

To 100 parts by weight of the above mentioned silane-modified straight chain low density polyethylene, 5 parts by weight of the same master batch as in Example 1 was added and mixed, and formed into a film having a thickness of 400 μm by using a film molding machine having a 150 mmφ extruder and a 1000 width T dice at a resin temperature of 230° C. and a casting speed of 4 m/min.

Film formation could be conducted without problems. The appearance and total ray transmittance of the resulting film were excellent. The polymerized Si amount in the resulting film was 1 ppm.

(2) Manufacture of Photovoltaic Module

The resulting film was used as an encapsulant layer, and the same transparent front face substrate, photovoltaic cell and rear face protecting sheet as in Example 1 were laminated in the same manner as in Example 1, and adhered under press at 150° C. for 15 minutes in a vacuum laminator for production of a photovoltaic module with the surface of the photovoltaic cell facing up, manufacturing a photovoltaic module of the present invention. The encapsulant sample was cut out from the resulting photovoltaic module and its gel fraction was measured to be 0%.

Comparative Example 4

(1) Manufacture of Encapsulant Layer

A film was manufactured in the same manner as in Example 12 except that 100 parts by weight of a straight chain low density polyethylene having a MFR of 0.01 g/10 min at 190° C. was used.

Film formation could be conducted though it was extremely difficult. The appearance and total ray transmittance of the resulting film were excellent. The polymerized Si amount in the resulting film was 3000 ppm.

(2) Manufacture of Photovoltaic Module

A photovoltaic module was manufactured in the same manner as in Example 12 using the film obtained above.

Comparative Example 5

(1) Manufacture of Encapsulant Layer

A film was manufactured in the same manner as in Example 13 except that 100 parts by weight of a straight chain low density polyethylene having a MFR of 60 g/10 min at 190° C. was used.

(2) Manufacture of Photovoltaic Module

A photovoltaic module was manufactured in the same manner as in Example 13 using the film obtained above. However, flow ability in module formation was high, consequently, constituents came into mutual contact and the cell was damaged, namely, module formation was impossible.

Comparative Example 6

(1) Manufacture of Encapsulant Layer 20 parts by weight of the same silane-modified straight chain low density polyethylene as in Example 1, 80 parts by weight of the same straight chain low density polyethylene as in Example 1, 5 parts by weight of the same master batch as in Example 1 and 5 parts by weight of a cross-linking agent were mixed, and a film having a polymerized Si amount of 3000 ppm was manufactured.

(2) Manufacture of Photovoltaic Module

The resulting film was used as an encapsulant layer, and a photovoltaic module of the present invention was manufactured in the same manner as in Example 1. The encapsulant sample was cut out from the resulting photovoltaic module and its gel fraction was measured to be 32%.

(Evaluation of Property)

The encapsulant layer s used in the photovoltaic modules obtained in Examples 1 to 18 and Comparative Examples 1 to 4 and 6 were subjected to the following tests.

(1) Measurement of Total Ray Transmittance

The total ray transmittance (%) of the encapsulant layer s used in the photovoltaic modules obtained in Examples 1 to 18 and Comparative Examples 1 to 4 and 6 was measured by a color computer. Specifically, the above mentioned encapsulant layer for photovoltaic module sheet was sandwiched in between ethylenetetrafluoroethylene copolymer films (manufactured by Asahi Glass Co., Ltd., trade name: AFLEX 100N), and they were adhered under press at 150° C. for 15 minutes by a vacuum laminator for production of a photovoltaic module, then, the above mentioned ethylenetetrafluoroethylene copolymer films were peeled, and only the above mentioned encapsulant layer for photovoltaic module sheet heated was subjected to measurement.

(2) Measurement of Adherence of Transparent Front Face Substrate

The peeling strength (N/15 mm width) between an encapsulant layer and a transparent front face substrate at room temperature (25° C.) directly after manufacture of the photovoltaic modules obtained in Examples 1 to 18 and Comparative Examples 1 to 4 and 6 and the peeling strength after being left for 1000 hours under high temperature and high humidity conditions of 85° C. and 85% was measured.

(3) Measurement of Adherence of Photovoltaic Cell

The peeling strength (N/15=width) between an encapsulant layer and a photovoltaic cell formed of polycrystalline silicon at room temperature (25° C.), after the photovoltaic modules obtained in Examples 1 to 18 and Comparative Examples 1 to 4 and 6 were left for 1000 hours under high temperature and high humidity conditions of 85° C. and 85%, was measured.

(4) Measurement of Output Maintenance Factor of Photoelectronic Power

The photovoltaic modules obtained in Examples 1 to 18 and Comparative Examples 1 to 4 and 6 were subjected to an environmental test according to JIS standard C8917, and output of photoelectronic power was measured before and after the test and evaluated in comparison.

The results of measurement of the above mentioned test are shown in Table 1.

TABLE 1

| | Total ray transmittance (%) | Adherence of transparent front face substrate (N/15 mm width) | | Adherence of photovoltaic cell (N/15 mm width) | Output maintenance factor (%) |
|---|---|---|---|---|---|
| | | (directly after production) | (after being left) | | |
| Example 1 | 95 | 65 | 45 | 42 | 98 |
| Example 2 | 95 | 51 | 31 | 35 | 97 |
| Example 3 | 93 | 64 | 44 | 40 | 98 |
| Example 4 | 94 | 53 | 33 | 37 | 96 |
| Example 5 | 93 | 50 | 30 | 36 | 96 |
| Example 6 | 93 | 49 | 29 | 34 | 96 |
| Example 7 | 93 | 53 | 33 | 35 | 97 |
| Example 8 | 94 | 1 | 0.5 | 0.8 | 80 |
| Example 9 | 95 | 150 | 140 | 60 | 92 |
| Example 10 | 98 | 51 | 3 | 32 | 82 |
| Example 11 | 70 | 51 | 30 | 38 | 96 |
| Example 12 | 93 | 50 | 33 | 35 | 96 |
| Example 13 | 98 | 49 | 5 | 38 | 85 |
| Example 14 | 92 | 50 | 30 | 34 | 90 |
| Example 15 | 93 | 110 | 80 | 55 | 95 |
| Example 16 | 95 | 45 | 28 | 31 | 80 |
| Example 17 | 92 | 90 | 50 | 50 | 95 |
| Example 18 | 94 | 60 | 35 | 40 | 96 |
| | Total ray transmittance (%) | Adherence of transparent front face base plate (N/15 mm width) | | Adherence of photovoltaic cell (N/15 mm width) | Output maintenance factor (%) |
| | | (directly after production) | (after being left) | | |
| Comparative Example 1 | 92 | 0 | 0 | 0 | 0 |
| Comparative Example 2 | 90 | 47 | 27 | 33 | 95 |
| Comparative Example 3 | 91 | 0.1 | 0.1 | 0.1 | 65 |
| Comparative Example 4 | 93 | 50 | 33 | 35 | 96 |
| Comparative Example 5 | — | — | — | — | — |
| Comparative Example 6 | 95 | 65 | 45 | 42 | 98 |

As apparent from measurement results shown in Table 1, the total ray transmittance of the encapsulant layer s used in the photovoltaic modules of Examples 1 to 18 was excellent. The peeling strength of the photovoltaic modules of Examples 1 to 18, at room temperature (25° C.), of a transparent front face substrate and a photovoltaic cell was also excellent, and the output maintenance factor of photoelectronic power was high.

In contrast, in Comparative Example 1, a silane-modified straight chain low density polyethylene was not used in an encapsulant layer, consequently, close adhesion with a transparent front face substrate and a photovoltaic cell was impossible and a photovoltaic module could not be manufactured. In Comparative Example 3, adhesion strength was weak, and a sufficient output maintenance factor as a photovoltaic module could not be maintained.

(Regeneration Test)

For Examples 1 to 18 and Comparative Examples 2, 4 and 6, reutilize ability of the transparent front face substrate and the photovoltaic cell was evaluated based on whether the removal of the encapsulant layer is possible or not.

Removal of the encapsulant layer was conducted according to the following method.

1. First Method

The resulting photovoltaic module was placed in an oven of 200° C. Five minutes after, the photovoltaic module was removed out of the oven, and separated into a transparent front face substrate, photovoltaic cell and rear face protecting sheet to which encapsulant layers plasticized by heating adhered respectively. The separated transparent front face substrate and photovoltaic cell carrying adhered encapsulant layers were placed on a retaining table, and soy oil heated at 200° C. was flown so that the oil will be in touch with the surface to which the encapsulant layer is adhered, and the encapsulant layer s were removed from the transparent front face substrate and the photovoltaic cell.

2. Second Method

The resulting photovoltaic module was placed in an oven of 200° C. Five minutes after, the photovoltaic module was removed out of the oven, and separated into a transparent front face substrate, photovoltaic cell and rear face protecting sheet to which encapsulant layers plasticized by heating adhered respectively. The separated transparent front face substrate and photovoltaic cell carrying adhered encapsulant layers were subjected to a shot blast method under a 200° C. atmosphere and encapsulant layers were removed from the transparent front face substrate and the photovoltaic cell.

3. Third Method

The resulting photovoltaic module was placed and heated on a hot plate of 200° C. Seven minutes after, the photovoltaic module was separated into a transparent front face substrate, photovoltaic cell and rear face protecting sheet to which encapsulant layers plasticized by heating adhered respectively. The separated transparent front face substrate and photovoltaic cell carrying adhered encapsulant layers were again placed on a hot plate, and encapsulant layers were wiped off with a cloth.

4. Fourth Method

The resulting photovoltaic module was heated in a silicon oil bath heated at 180° C. Twenty minutes after, a back cover was peeled from the separable layer plasticized by heating. Next, a $\phi 0.15$ mm wire was put through the separable layer, plasticized by heating, between glass and photovoltaic cell, for separation into a transparent front face substrate and photovoltaic cell carrying adhered encapsulant layers. The separated transparent front face substrate and photovoltaic cell carrying adhered encapsulant layers were immersed in a xylene bath heated at 80° C. and left for 24 hours. After being left, the photovoltaic cell and transparent front face substrate were taken out, and separable layers remaining on the element and glass surface were gently wiped off with a waste cloth.

5. Fifth Method

The resulting photovoltaic module was heated in a silicon oil bath heated at 180° C. Twenty minutes after, a back cover was peeled from the separable layer plasticized by heating. Next, a $\phi 0.15$ mm wire was put through the separable layer, plasticized by heating, between glass and photovoltaic cell, for separation into a transparent front face substrate and photovoltaic cell carrying adhered encapsulant layers. The separated transparent front face substrate and photovoltaic cell carrying adhered encapsulant layers were placed on a hot plate of 200° C., and stearic acid was poured on a softened separable layer for dissolution, and the dissolved separable layer was gently wiped of with a waste cloth.

6. Sixth Method

The resulting photovoltaic module was heated in a silicon oil bath heated at 180° C. Twenty minutes after, the rear face protecting sheet was peeled from the separable layer plasticized by heating. Next, a $\phi 0.15$ mm wire was put through the separable layer, plasticized by heating, between the transparent front face substrate and the photovoltaic cell, for separation into a transparent front face substrate and photovoltaic cell carrying adhered encapsulant layers.

The separated transparent front face substrate and photovoltaic cell carrying adhered encapsulant layers were placed on a hot plate of 200° C., and stearic acid was poured on a softened separable layer, and the encapsulant layer s were removed. Thereafter, the photovoltaic cell and transparent front face substrate carrying encapsulant layers remaining on the surface were immersed in a xylene bath heated at 80° C. and left for 240 hours, to peel the separable layer from the photovoltaic cell and to peel the separable layer from the transparent front face substrate.

7. Seventh Method

The resulting photovoltaic module was heated in a silicon oil bath heated at 180° C. Twenty minutes after, the rear face protecting sheet was peeled from the separable layer plasticized by heating. Next, a $\phi 0.15$ mm wire was put through the separable layer, plasticized by heating, between the transparent front face substrate and the photovoltaic cell, for separation into a transparent front face substrate and photovoltaic cell carrying adhered encapsulant layers. The separated transparent front face substrate and the photovoltaic cell carrying adhered encapsulant layers were immersed in a xylene bath heated at 80° C. and left for 240 hours. After being left, the photovoltaic cell and the transparent front face substrate carrying encapsulant layers remaining on the surface were taken out and placed on a hot plate of 200° C., and stearic acid was poured on a softened separable layer and the separable layer was gently wiped off with a waste cloth.

8. Eighth Method

The resulting photovoltaic module was heated in a silicon oil bath heated at 190° C. Two minutes after, the rear face protecting sheet was peeled from the separable layer plasticized by heating. Next, using a separation device shown in FIG. 2, a $\phi 0.08$ mm wire was put through the separable layer, plasticized by heating, between the transparent front face substrate and the photovoltaic cell, for separation into a transparent front face substrate and photovoltaic cell carrying adhered encapsulant layers. The photovoltaic cell and the transparent front face substrate carrying encapsulant layers remaining on the surface were taken out and placed on a hot plate of 190° C., and the separable layer was gently wiped off with a waste cloth.

9. Ninth Method

The resulting photovoltaic module was heated in a silicon oil bath heated at 195° C. Two minutes after, the rear face protecting sheet was peeled from the separable layer plasticized by heating. Next, using a separation device shown in FIG. 2, a $\phi$0.08 mm wire was put through the separable layer, plasticized by heating, between the transparent front face substrate and the photovoltaic cell, for separation into a transparent front face substrate and photovoltaic cell carrying adhered encapsulant layers. The separated transparent front face substrate and the photovoltaic cell carrying adhered encapsulant layers were immersed in a xylene bath heated at 80° C. and left for 2 hours. The separable layers remaining on the surface of the photovoltaic cell and transparent front face substrate were gently wiped off with a waste cloth.

10. Tenth Method

The resulting photovoltaic module was immersed in a xylene bath heated at 80° C. and left for 20 hours. After being left, The separable layers remaining on the surface of the photovoltaic cell and transparent front face substrate were gently wiped off with a waste cloth.

Using the above mentioned ten methods, the surfaces of the transparent front face substrate and the photovoltaic cell, taken out of the photovoltaic modules obtained in Examples 1 to 18 and Comparative Examples 2, 4 and 6, were visually observed to confirm if the encapsulant layer was removed or not. In removal of the encapsulant layer by the above mentioned methods (separating process and removing process), when oil and the like is adhered, cleaning with a solvent such as isopropyl alcohol and the like was conducted as necessity.

As a result of the above mentioned evaluation, removal of the encapsulant layer from the transparent front face substrate and the photovoltaic cell was rather difficult in Examples 9, 11, 12 and 15, while in the photovoltaic modules obtained in Examples 1 to 18, removal of the encapsulant layer from the transparent front face substrate and the photovoltaic cell was possible by any of the above mentioned first to tenth methods. And the transparent front face substrate and the photovoltaic cell recovered by removing the encapsulant layer could be reused or recycled.

On the other hand, in the photovoltaic module obtained in Comparative Example 2, the photovoltaic module could not be disassembled by any of the above mentioned first to tenth methods. The transparent front face substrate and the photovoltaic cell could not be recovered from the photovoltaic module and could not be reused or recycled. In Comparative Example 4, since plasticity after softening was low, removal of the encapsulant layer from the transparent front face substrate and the photovoltaic cell was extremely difficult so that they could not be reused or recycled. Further, in Comparative Example 6, disassemble of the photovoltaic module was extremely difficult so that reusing or recycling was impossible.

What is claimed is:

1. A method for manufacturing a regenerated photovoltaic cell, wherein a regenerated photovoltaic cell is obtained from a photovoltaic module comprising an encapsulant layer for photovoltaic module, placed on at least one surface of a photovoltaic cell, comprising: a heating process of heating the photovoltaic module at temperatures not lower than the softening temperature of a thermoplastic resin which is a constituent material of the separable layer;
   a separating process of peeling the separable layer, plasticized by heating, to separate the photovoltaic cell; and
   removing process of removing the encapsulant layer adhered to the photovoltaic cell.

2. The method for manufacturing a regenerated photovoltaic cell according to claim 1, wherein the removing process is carried out by physical cleaning of physically removing the encapsulant layer, chemical cleaning of chemically removing the encapsulant layer, or a combination thereof.

3. A method for manufacturing a regenerated transparent front face substrate, wherein a regenerated transparent front face substrate is obtained from a photovoltaic module comprising an encapsulant layer for photovoltaic module, placed on at least one surface of a photovoltaic cell, comprising:
   a heating process of heating the photovoltaic module at temperatures not lower than the softening temperature of a thermoplastic resin which is a constituent material of the separable layer;
   a separating process of peeling the separable layer, plasticized by heating, to separate the transparent front face substrate; and
   a removing process of removing the encapsulant layer adhered to the transparent front face substrate.

4. The method for manufacturing a regenerated transparent front face substrate according to claim 3, wherein the removing process is carried out by physical cleaning of physically removing the encapsulant layer, chemical cleaning of chemically removing the encapsulant layer, or a combination thereof.

5. A method for reutilizing a photovoltaic module, wherein a component from a photovoltaic module comprising an encapsulant layer for photovoltaic module, placed on at least one surface of a photovoltaic cell is reutilized, comprising:
   a heating process of heating the photovoltaic module at temperatures not lower than the softening temperature of a thermoplastic resin which is a constituent material of the separable layer; and
   a separating process of peeling the separable layer plasticized by heating to separate the transparent front face substrate.

6. The method for reutilizing the photovoltaic module according to claim 5, wherein the separating process comprises a rear face protecting sheet separating process of separating a rear face protecting sheet from the photovoltaic module.

* * * * *